United States Patent
Kim et al.

(10) Patent No.: US 10,854,837 B2
(45) Date of Patent: *Dec. 1, 2020

(54) DISPLAY DEVICE AND METHOD OF MANUFACTURING THE SAME

(71) Applicant: SAMSUNG DISPLAY CO., LTD., Yongin-si (KR)

(72) Inventors: Jaybum Kim, Seoul (KR); Eoksu Kim, Seoul (KR); Kyoungseok Son, Seoul (KR); Junhyung Lim, Seoul (KR); Jihun Lim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/911,525

(22) Filed: Jun. 25, 2020

(65) Prior Publication Data

US 2020/0328369 A1    Oct. 15, 2020

Related U.S. Application Data

(63) Continuation of application No. 16/836,005, filed on Mar. 31, 2020, now Pat. No. 10,790,467, which is a
(Continued)

(30) Foreign Application Priority Data

Sep. 2, 2016 (KR) .......................... 10-2016-0113445

(51) Int. Cl.
*H01L 51/52* (2006.01)
*G09G 3/32* (2016.01)
(Continued)

(52) U.S. Cl.
CPC .......... *H01L 51/5203* (2013.01); *G09G 3/32* (2013.01); *G09G 3/3233* (2013.01);
(Continued)

(58) Field of Classification Search
CPC ............ H01L 27/3262; H01L 27/3248; H01L 27/1255; H01L 27/3244; H01L 27/3272; H01L 2227/323
See application file for complete search history.

(56) References Cited

U.S. PATENT DOCUMENTS 8,067,775 B2   11/2011   Miyairi et al.
9,129,927 B2   9/2015    Gupta et al.
(Continued)

FOREIGN PATENT DOCUMENTS

KR   10-1048965   7/2011
KR   10-1073301   10/2011
(Continued)

OTHER PUBLICATIONS

Yamazaki, et al., "Research, Development, and Application of Crystalline Oxide Semiconductor", SID 2012 Digest, pp. 183-186.
(Continued)

*Primary Examiner* — Zandra V Smith
*Assistant Examiner* — John M Parker
(74) *Attorney, Agent, or Firm* — F. Chau & Associates, LLC

(57) ABSTRACT

A display device includes a base substrate, a first transistor, a second transistor, an organic light emitting diode, and a capacitor electrically connected to the first thin film transistor. The first transistor includes a first semiconductor pattern below a first interlayer insulation layer and a first control electrode above the first interlayer insulation layer and below a second interlayer insulation layer. The second transistor includes a second control electrode above the first interlayer insulation layer and below the second interlayer insulation layer. A second semiconductor pattern is above the second interlayer insulation layer.

16 Claims, 16 Drawing Sheets

Related U.S. Application Data continuation of application No. 16/459,060, filed on Jul. 1, 2019, now Pat. No. 10,673,008, which is a continuation of application No. 15/657,369, filed on Jul. 24, 2017, now Pat. No. 10,340,472.

(51) Int. Cl.
| | | |
|---|---|---|
| *H01L 51/00* | (2006.01) | |
| *H01L 27/11* | (2006.01) | |
| *H01L 27/32* | (2006.01) | |
| *G09G 3/3233* | (2016.01) | |

(52) U.S. Cl.
CPC ...... *H01L 27/1108* (2013.01); *H01L 27/3262* (2013.01); *H01L 51/0096* (2013.01); *G09G 2300/0426* (2013.01); *G09G 2300/0814* (2013.01); *G09G 2300/0842* (2013.01); *G09G 2300/0861* (2013.01); *G09G 2300/0866* (2013.01); *G09G 2310/0245* (2013.01); *G09G 2310/0262* (2013.01); *H01L 27/3265* (2013.01); *H01L 51/0023* (2013.01); *H01L 51/5296* (2013.01); *H01L 2227/323* (2013.01)

(56) References Cited

U.S. PATENT DOCUMENTS

| | | |
|---|---|---|
| 9,601,052 B2 | 3/2017 | Jeon |
| 9,721,973 B2 | 8/2017 | Lee et al. |
| 9,806,139 B2 | 10/2017 | Sato |
| 9,911,762 B2 | 3/2018 | Yan et al. |
| 10,340,472 B2 | 7/2019 | Kim et al. |
| 10,673,008 B2 | 6/2020 | Kim et al. |
| 2010/0019996 A1 | 1/2010 | You et al. |
| 2013/0168666 A1 | 7/2013 | Yan et al. |
| 2014/0346478 A1* | 11/2014 | Cho .................. H01L 27/1248 257/40 |
| 2015/0055047 A1 | 2/2015 | Chang et al. |
| 2015/0243683 A1 | 8/2015 | Lee et al. |
| 2018/0069190 A1 | 3/2018 | Kim et al. |
| 2019/0326543 A1 | 10/2019 | Kim et al. |

FOREIGN PATENT DOCUMENTS

| | | |
|---|---|---|
| KR | 10-2015-0051824 | 5/2015 |
| KR | 10-2015-0101403 | 9/2015 |
| KR | 10-1622182 | 5/2016 |

OTHER PUBLICATIONS

Kobayashi, et al., "Electrical Characteristics and Short-Channel Effect of C-Axis Aligned Crystal Idium Gallium Zinc Oxide Transistor With Short Channel Length", Japanese Journal of Applied Physics, 53, 04EF (2014), pp. 04EF03-1-04EP03-5.

Yamazaki, et al., "Future Possibilities of Crystalline Oxide Semiconductor, Especially C-Axis-Aligned Crystalline IGZO", SID 2015 Digest, pp. 673-676.

S. Matsuda, et al., "Channel Length Dependence of Field-Effect Mobility of C-Axis-Aligned Crystalline In—Ga—Zn—O Field-Effect Transistors", Japanese Journal of Applied Physics, 54, (2015), pp. 041103-1-041103-4

K. Park, et al., "Reliability of Crystalline Indium-Gallium-Zinc-Oxide Thin-Film Transistors Under Bias Stress With Light Illumination", IEEE Transactions of Electron Devices., vol. 62, No. 9, Sep. 2015, pp. 2900-2905.

J. Zhang, et al., "Flexible Indium-Gallium-Zinc-Oxide Schottky Diode Operating Beyond 2.45 GHz", Nature Communications, pp. 1-7.

* cited by examiner

DISPLAY DEVICE AND METHOD OF MANUFACTURING THE SAME

CROSS-REFERENCE TO RELATED APPLICATIONS

This application is a Continuation of U.S. patent application Ser. No. 16/836,005 filed on Mar. 31, 2020, which is a Continuation of U.S. patent application Ser. No. 16/459,060, filed on Jul. 1, 2019, now U.S. Pat. No. 10,673,008 issued on Jun. 2, 2020, which is a continuation of U.S. patent application Ser. No. 15/657,369, filed on Jul. 24, 2017, now U.S. Pat. No. 10,340,472 issued on Jul. 2, 2019, which claims priority under 35 U.S.C. § 119 to Korean Patent Application No. 10-2016-0113445, filed on Sep. 2, 2016, the disclosures of which are incorporated by reference herein in their entireties.

TECHNICAL FIELD

Exemplary embodiments of the present invention relate to a display device, and more particularly to a method of manufacturing the same.

DISCUSSION OF RELATED ART

A display device may include a plurality of pixels and a driving circuit (e.g., scan driving circuit and a data driving circuit) controlling the plurality of pixels. Each of the plurality of pixels may include a display element and a pixel driving circuit controlling the display element. The pixel driving circuit may include a plurality of thin film transistors connected organically to each other.

A scan driving circuit and a data driving circuit may be formed through the same process as the plurality of pixels. The driving circuits may include a plurality of thin film transistors connected organically to each other.

According to a driving timing, different bias voltages may be applied to a control electrode, an input electrode, and output electrode of each of thin film transistors in a pixel driving circuit. According to a driving timing, different bias voltages may be applied to a control electrode, an input electrode, and output electrode of each of thin film transistors in a scan driving circuit anchor a data driving circuit.

SUMMARY

An exemplary embodiment of the present invention provides a display device including thin film transistors with increased turn-on speed and reliability.

An exemplary embodiment of the present invention provides a method of manufacturing a display device including thin film transistors.

An exemplary embodiment of the present invention provides a display device including a base substrate and a first transistor above the base substrate. The first thin film transistor includes a first input electrode, a first output electrode, a first semiconductor pattern below a first insulation layer, and a first control electrode above the first insulation layer and below a second insulation layer. A second transistor is above the base substrate. The second transistor includes a second input electrode, a second output electrode, a second control electrode above the first insulation layer and below the second insulation layer, and a second semiconductor pattern above the second insulation layer. At least one third insulation layer is above the second insulation layer. A light emitting diode is above the at least one third insulation layer and above the second control electrode. A capacitor is electrically connected to at least one of the first transistor and the second transistor.

In an exemplary embodiment of the present invention, the first semiconductor pattern may include polysilicon semiconductor and the >second semiconductor pattern may include an oxide semiconductor.

In an exemplary embodiment of the present invention, the oxide semiconductor may include vertical crystals.

In an exemplary embodiment of the present invention, each of the second input electrode and the second output electrode may include a lower portion in direct contact with the second semiconductor pattern. An upper portion of each of the second input electrode and the second output electrode may be disposed on the at least one third insulation layer and may be connected to the lower portion via a first contact hole penetrating the at least one third insulation layer.

In an exemplary embodiment of the present invention, each of the first input electrode and the first output electrode may be disposed on the at least one third insulation layer and may be connected to the first semiconductor pattern via a second contact hole penetrating the first insulation layer, the second insulation layer, and the at least one third insulation layer.

In an exemplary embodiment of the present invention, the capacitor may include a first electrode disposed on a same layer as the first control electrode, and a second electrode disposed on a same layer as the lower portion. The second insulation layer may be disposed between the first electrode and the second electrode.

In an exemplary embodiment of the present invention, the display device may include a dummy semiconductor pattern disposed between the second electrode and the second insulation layer.

In an exemplary embodiment of the present invention, the dummy semiconductor pattern and the second semiconductor pattern may include a same semiconductor material.

In an exemplary embodiment of the present invention the ion per portion of the second input electrode and the lower portion of the second output electrode may be spaced apart from each other a first direction on the second semiconductor pattern. The lower portion of the second input electrode and the lower portion of the second output electrode may be in direct contact with upper and side surfaces of the second semiconductor pattern on a plane.

In an exemplary embodiment of the present invention, a first outer surface of the lower portion of the second input electrode may be substantially aligned with a first outer surface of the second semiconductor pattern. A second outer surface of the lower portion of the second output electrode may be substantially aligned with a second outer surface of the second semiconductor pattern.

In an exemplary embodiment of the present invention, the display device may include a conductive pattern overlapping the first control electrode and disposed on the second insulation layer.

In an exemplary embodiment of the present invention, the conductive pattern may be connected to one of the first and second electrodes of the capacitor.

In an exemplary embodiment of the present invention, the display device may include a dummy semiconductor pattern disposed between the conductive pattern and the second insulation layer.

In an exemplary embodiment of the present invention, the dummy semiconductor pattern and the second semiconductor pattern may include a semiconductor material.

In an exemplary embodiment of the present invention, a portion of the second semiconductor pattern overlapping the lower portion may be doped with a dopant and the dummy semiconductor patters may be doped with the same dopant as the portion of the second semiconductor pattern.

In an exemplary embodiment of the present invention, the second thin film transistor may include a third control electrode disposed on the at least one third insulation layer. The third control electrode may be electrically connected to the second control electrode.

An exemplary embodiment of the present invention provides a method of manufacturing a display device. The method includes forming a first semiconductor pattern above a base substrate. The method includes forming a first insulation layer substantially covering the first semiconductor pattern on the base substrate. The method includes forming a first control electrode overlapping the first semiconductor pattern and a second control electrode spaced apart from the first control electrode on the first insulation layer. The method includes forming a second insulation layer substantially covering the first control electrode and the second control electrode on the first insulation layer. The method includes forming a second semiconductor pattern overlapping the second control electrode, and a lower portion of a second input electrode and a lower portion of a second output electrode connected to the second semiconductor pattern on the second insulation layer. The method includes forming at least one third insulation layer on the second insulation layer; forming an upper portion of the second input electrode and an upper portion of the second output electrode respectively connected to the lower portion of the second input electrode and the lower portion of the second output electrode on the third insulation layer. The method includes forming a first input electrode and a first output electrode connected to the first semiconductor pattern. A portion of each of the first input electrode and the first output electrode is disposed on the third insulation layer. The method includes forming a light emitting diode on the at least one third insulation layer.

In an exemplary embodiment of the present invention, the forming of the second semiconductor pattern, the lower portion of the second input electrode, and the lower portion of the second output electrode may include forming a semiconductor layer on the second insulation layer. A conductive layer may be formed on the semiconductor layer. Forming the second semiconductor pattern, the lower portion of the second input electrode, and the lower portion of the second output electrode may include etching the semiconductor layer and the conductive layer by using a halftone mask including a first light shielding portion in a position corresponding to the lower portion of the second input electrode, a second light shielding portion in a position corresponding to the lower portion of the second output electrode, and a semi-transparent portion disposed between the first light shielding portion and the second light shielding portion.

In an exemplary embodiment of the present invention, the method may include forming a dummy semiconductor pattern overlapping the first control electrode on the second insulation layer. A conductive pattern may be formed on the dummy semiconductor pattern.

In an exemplary embodiment of the present invention, the method may include forming a third control electrode connected to the second control electrode on the at least one third insulation layer.

BRIEF DESCRIPTION OF THE FIGURES

The above and other features of the present invention will become more apparent by describing in detail exemplary embodiments thereof with reference to the accompanying drawings, in which.

DETAILED DESCRIPTION

Figure 1:
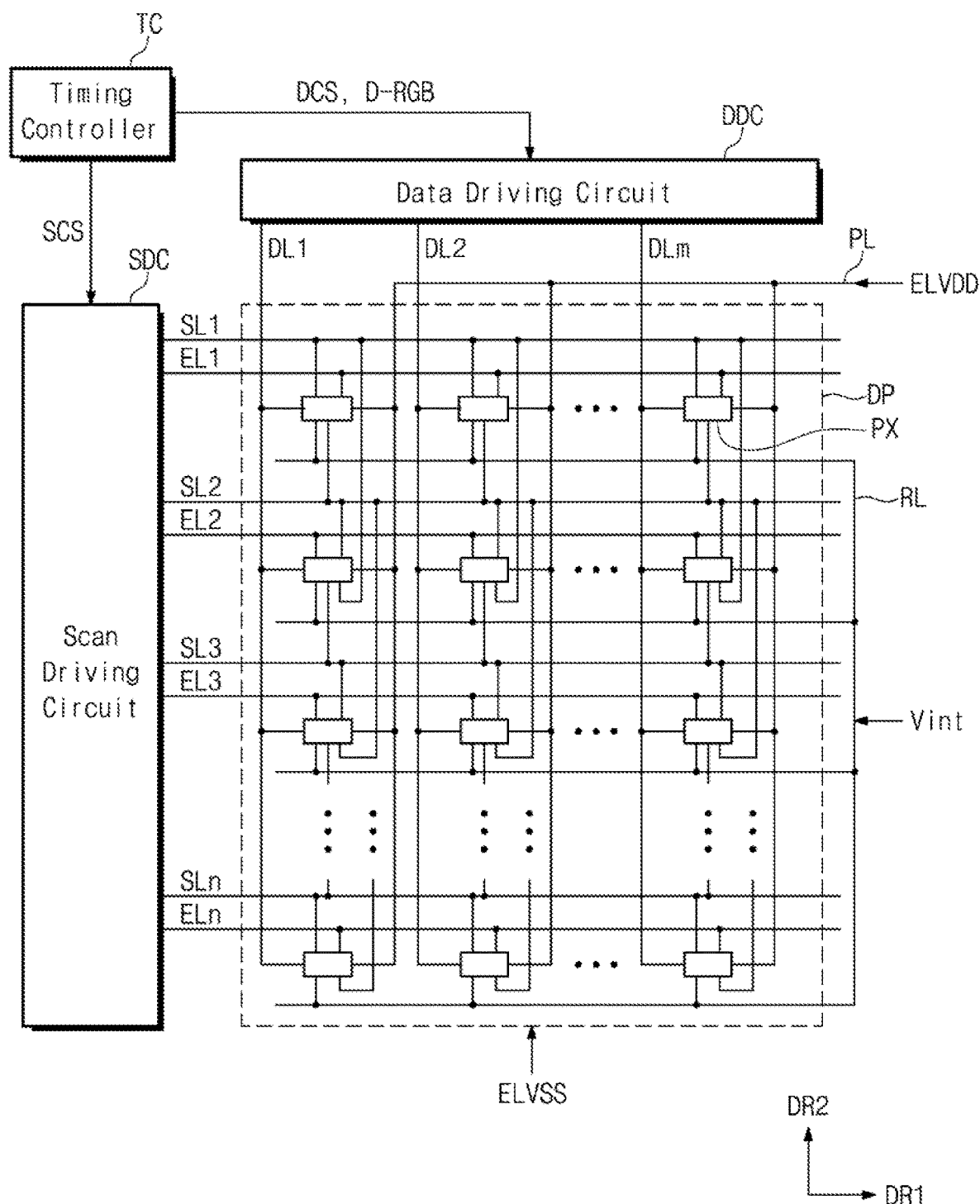
FIG. 1 is a block diagram of a display device according to an exemplary embodiment of the present invention.

It will be understood that when a component, such as a layer, a film, a region, or a plate, is referred to as being "on" another component, the component can be directly on the other component or intervening components may be present.

Like reference numerals may refer to like elements throughout the specification and drawings.

It will be understood that although the terms "first" and "second" may be used herein to describe various components, these components should not be limited by these terms.

FIG. 1 is a block diagram of a display device according to an exemplary embodiment of the present invention.

A display device according to an exemplary embodiment of the present invention may include a timing controller TC, a scan driving circuit SDC, a data driving circuit DDC, and a display panel DP. In an exemplary embodiment of the present invention, the display panel DP may be a light emitting type display panel; however, exemplary embodiments of the present invention are not limited thereto The timing controller TC may receive input image signals and may generate image data D-RGB by converting a data format of the input image signals to match the interface specifications of the scan driving circuit SDC. The timing controller TC may output the image data D-RGB and various control signals DCS and SCS.

The scan driving circuit SDC may receive a scan control signal SCS from the timing controller TC. The scan control signal SCS may include a vertical start signal stating an operation of the scan driving circuit SDC and a clock signal determining the output timings of signals. The scan driving circuit SDC may generate a plurality of scan signals and may sequentially output each of the scan signals to a respective scan line of a plurality of scan lines SL1 to SLn. The scan driving circuit SDC may generate a plurality of light emitting control signals in response to the scan control signal SCS and may output each of the plurality of light emitting control signals to a respective light emitting line of a plurality of light emitting lines EL1 to ELn.

The plurality of scan signals and the plurality of light emitting control signals may be outputted from one scan driving circuit SDC; however, exemplary embodiments of the present invention are not limited thereto. According to an exemplary embodiment of the present invention, a plurality of scan driving circuits may each output some of the plurality of scan signals and some of the plurality of light emitting control signals. According to an exemplary embodiment of the present invention, a first driving circuit generating and outputting a plurality of first scan signals and a second driving circuit generating and outputting a plurality of second light emitting control signals different from the first plurality of first scan signals may be separated from each other.

The data driving circuit DDC may receive the data control signal DCS and the image data D-RGB from the timing control unit TC. The data driving circuit DDC may convert the image data D-RGB into data signals and may output each of the data signals to a respective data line of a plurality of data lines DL1 to DLm. The data signals may each be analog voltages corresponding to the grayscale values of the image data D-RGB.

The light emitting display panel DP may include a plurality of scan lines SL1 to SLn, a plurality of light emitting lines EL1 to ELn, a plurality of data lines DL1 to DLm, and a plurality of pixels PX. The plurality of scan lines SL1 to SLn may extend in a first direction DR1 and may be arranged in a second direction DR2 orthogonal to the first direction DR1. Each of the plurality of light emitting lines EL1 to ELn may be arranged substantially parallel to a corresponding scan line among the plurality of scan lines SL1 to SLn. The plurality of data lines DL1 to DLm may intersect the plurality of scan lines SL1 to SLn. The plurality of data lines DL1 to DLM may be insulated front the plurality of scan lines SL1 to SLn. Each of the plurality of pixels PX may be connected to a respective scan line among the plurality of scan lines SL1 to SLn, a respective light emitting line among the plurality of light emitting lines EL1 to ELn, and a respective data line among the plurality of data lines DL1 to DLm.

Each of the plurality of pixels PX may receive a first voltage ELVDD and a second voltage ELVSS having a lower level than the first voltage ELVDD. Each of the plurality of pixels PX may be connected to a power line PL to which the first voltage ELVDD is applied. Each of the plurality of pixels PX may be connected to an initialization line RL receiving an initialization voltage Vint.

Each of the plurality of pixels PX may be electrically connected to three scan lines. Referring to FIG. 1, the pixels of the second pixel row may be connected to the first to third scan lines SL1 to SL3.

The display panel DP may include a plurality of dummy scan lines. The light emitting display panel DP may include a dummy scan line connected to the pixels PX of the first pixel row and a dummy scan line connected to the pixels PX of the nth pixel row. A plurality of pixels (e.g., pixels arranged in a pixel column) may be connected to one data line among the plurality of data lines DL1 to DLm and may be connected to each other. For example, an adjacent two pixels among the plurality of pixels off a pixel column may be electrically connected to each other.

A display device according to an exemplary embodiment of the present invention is not limited to a particular type of display device. For example, in a configuration of a pixel driving circuit in a display device according to an exemplary embodiment of the present invention, signal lines may be added or omitted, as desired. Additionally, a connection relationship between a pixel and one or more scan lines may be changed, as desired.

The plurality of pixels PX may include red pixels emitting red light, green pixels emitting green light, and blue pixels emitting blue light. Each of the plurality of pixels PX may include a light emitting diode and a pixel driving circuit controlling the light emission of the light emitting diode. A light emitting, diode of the red pixel, a light emitting diode of the green pixel, and a light emitting diode of the blue pixel may each include light emitting layers including different materials from each other. In an exemplary embodiment of the present invention, the light emitting diode may be an organic light emitting diode including an organic light emitting layer. However, exemplary embodiments of the present invention are not limited thereto. The light emitting layer may include an inorganic light emitting material such as a quantum dot, a quantum rod, or a quantum tube. As an example, an organic light emitting display panel will be described in more detail below.

A pixel driving circuit may include a plurality of thin transistors and a capacitor electrically connected to the plurality of thin film transistors. At least one of the scan driving circuit SDC and the data driving circuit DDC may include a plurality of thin film transistors formed through the same process as the pixel driving circuit.

The plurality of scan lines SL1 to SLn, the plurality of light emitting lines EL1 to ELn, the plurality of data lines DL1 to DLm, the power line PL, the initialization line RL the plurality of pixels PX, the scan driving circuit SDC, and the data driving circuit DDC may be formed on a base substrate through a plurality of iterations of a photolithography process. A plurality of iterations of a deposition process or a coating process may be performed, and thus a plurality of insulation layers may be formed on a base substrate. Each of the plurality of insulation layers may be a thin film covering substantially the entire display panel DP (e.g., substantially the entire upper surface of a base substrate SUB described in more detail below with reference to FIG. 2). Each of the plurality of insulation layers may include at least one insulation pattern overlapping at least a portion of the display panel DP. The insulation layers may each include an organic layer and/or an inorganic layer. A sealing layer protecting the plurality of pixels PX may be disposed on the base substrate SUB.

Figure 2A:
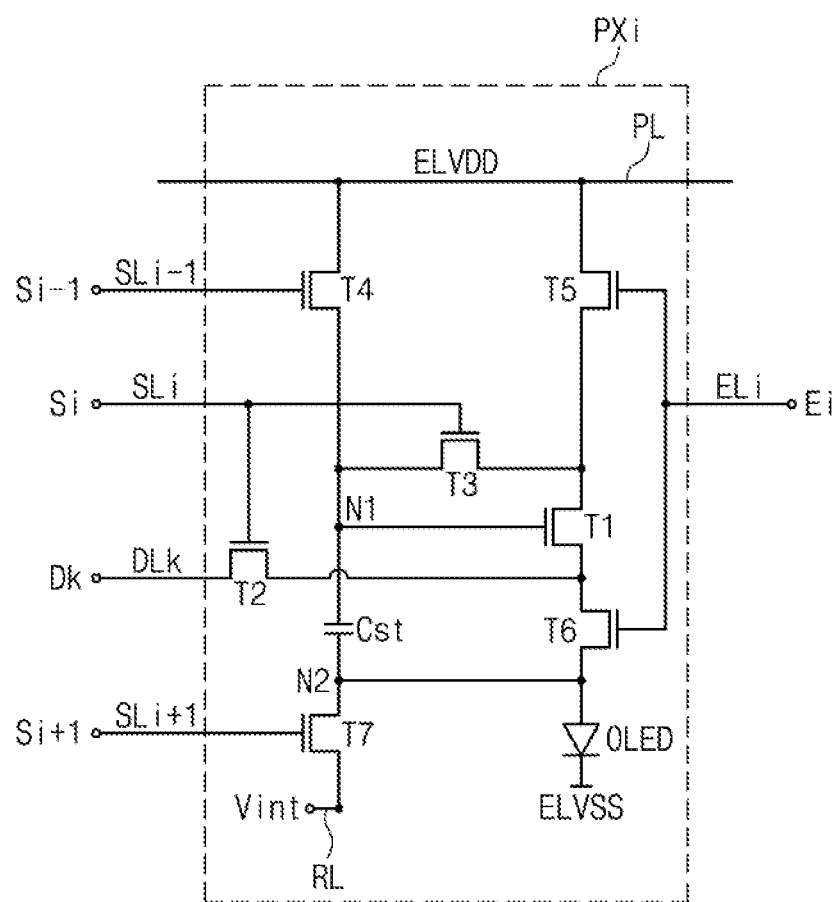
FIG. 2A is an equivalent circuit diagram of a pixel according to an exemplary embodiment of the present invention.
Figure 2B:
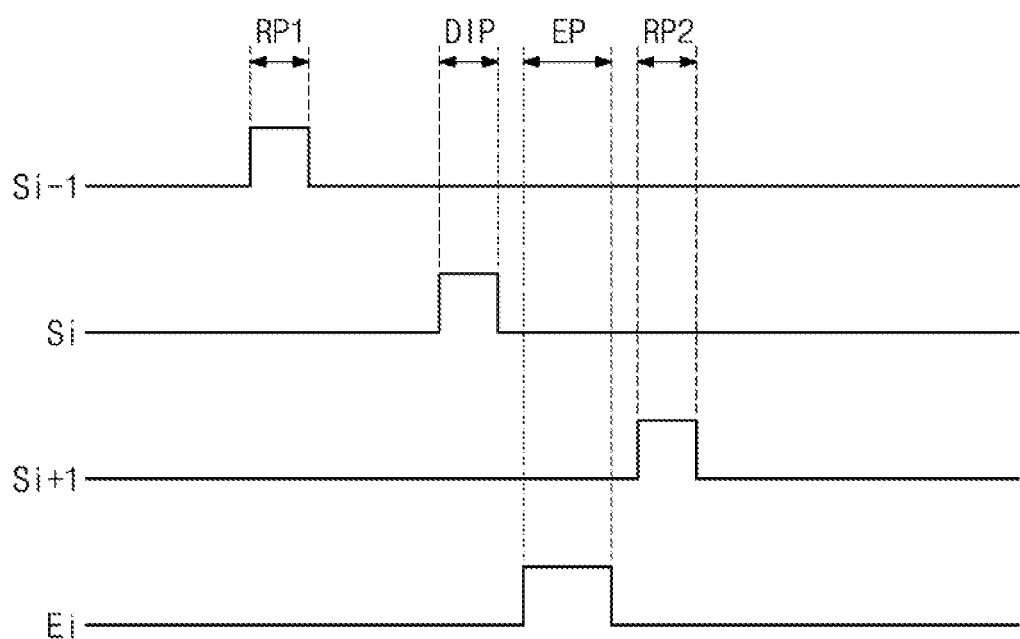
FIG. 2B is a waveform diagram of driving signals for driving a pixel shown in FIG. 2A.

FIG. 2A is an equivalent circuit diagram of a pixel according to an exemplary embodiment of the present invention. FIG. 2B is a waveform diagram of driving signals for driving a pixel shown in FIG. 2A.

Referring to FIG. 2A, an ith pixel PXi may be connected to the kth data line DLk among the plurality of data lines DL1 to DLm. The ith pixel PXi may be activated in response to the ith scan signal Si applied to the ith scan line SLi.

The ith pixel PXi may include an organic light emitting diode OLED and a pixel driving circuit controlling the organic light emitting diode OLED. As an example, a pixel driving circuit may include seven thin film transistors T1 to T7 and one capacitor Cst. As an example, the seven thin film transistors T1 to T7 are described as N-type thin film transistors; however, exemplary embodiments of the present invention are not limited thereto. In an exemplary embodiment of the present invention, the seven thin film transistors T1 to T7 may be P-type thin film transistors. As used herein, the term "transistor" may refer to a thin film transistor.

The driving transistor may control a driving current supplied to the organic light emitting diode OLED. According to an exemplary embodiment of the present invention, the driving transistor may be a first transistor T1. The output electrode of the first transistor T1 may be electrically connected to the organic light emitting diode OLED. The output electrode of the first transistor T1 may be in direct contact with the anode of the organic light emitting diode OLED or may be connected to the anode through another transistor.

The control electrode of the control transistor may receive a control signal. A control signal applied to the ith pixel PXi may include the i−1th scan signal Si−1, the ith scan signal Si, the i+1th scan signal Si+1, a data signal DK, and the ith light emitting control signal Ei. According to an exemplary embodiment of the present invention, the control transistor may include the second to seventh transistors T2 to T7.

A node between the output electrode of the fourth transistor T4 and the control electrode of the first transistor T1 may be a first node N1 and a node between the seventh transistor T7 and the capacitor Cst may be a second node N2.

The first transistor T1 may include an input electrode receiving the first voltage ELVDD via the fifth transistor T5, a control electrode connected to the first node N1, and an output electrode. The output electrode of the first transistor T1 may provide the first voltage ELVDD to the organic light emitting diode OLED via the sixth transistor T6. The input electrode of the first transistor T1 may be connected to the first node N1 via the third transistor T3. The first transistor T1 may control a driving current supplied to the organic light emitting diode OLED according to the potential of the first node N1.

The second transistor T2 may include an input electrode connected to the kth data line DLk, a control electrode connected to the ith scan line SLi, and an output electrode connected to the output electrode of the first transistor T1. The second transistor T2 may be turned on by the scan signal Si (e.g., the ith scan signal) applied to the ith scan line GLi, and may provide a data signal Dk applied to the kth data line DLk to the capacitor Cst. The second transistor T2 may be referred to as a switching transistor.

The third transistor T3 may include an input electrode connected to the input electrode of the first transistor T1, a control electrode connected to the ith scan line SLi, and an output electrode connected to the first node N1. The third transistor T3 may be turned on in response to the ith scan signal Si.

When the second transistor T2 and the third transistor T3 are turned on, the first transistor T1 may be connected in a diode form between the second transistor T2 and the third transistor T3. Thus, the second transistor T2 may be connected to the first node via the first transistor T1 and the third transistor T3.

The capacitor Cst may be connected between the first node N1 and the anode of the organic light emitting diode OLED. The capacitor Cst may store a voltage corresponding to a voltage applied to the first node N1.

The fourth transistor T4 may include ate input electrode connected to the power line PL, a control electrode receiving the i−1th scan signal Si−1, and an output electrode connected to the first node N1. The fourth transistor T4 may be turned on in response to the i−1th scan signal Si−1. The control electrode of the fourth transistor T4 may be connected to the i−1th scan line SLi−1. A signal line transmitting the i−1th scan signal Si−1 may be changed to a dummy signal line.

The fifth transistor T5 may include an input electrode connected to the power line PL, a control electrode connected to the ith light emitting line ELi, and an output electrode connected to the input electrode of the first transistor T1. The fifth transistor T5 may be turned on in response to the ith light emitting control signal Ei.

The sixth transistor T6 may include an input electrode connected to the output electrode of the first transistor T1, a control electrode connected to the ith light emitting line ELi, and an output electrode connected to the anode of the organic light emitting diode OLED. The sixth transistor T6 may be turned on in response to the ith light emitting control signal Ei supplied from the ith light emitting line ELi.

According to operations of the fifth transistor T5 and the sixth transistor T6, a current path may be formed or blocked between the power line PL and the organic light emitting diode OLED. According to an exemplary embodiment of the present invention, one of the fifth transistor T5 or the sixth transistor T6 may be omitted.

The seventh transistor T7 may include an input electrode connected to the initialization line RL, a control electrode receiving the i+1th scan signal Si+1, and an output electrode connected to the anode of the organic light emitting diode OLED. The control electrode of the seventh transistor T7 may be connected to the i+1th scan line SLi+1. A signal line transmitting the i+1th scan signal Si+1 may be changed to a dummy signal line.

When the fourth transistor T4 is turned on, the first node N1 may be reset by the first voltage ELVDD. When the seventh transistor T7 is turned on, the second node N2 may be initialized by the initialization voltage Vint. When the seventh transistor T7 is turned on, the anode of the organic light emitting diode OLED may be initialized by the initialization voltage Vint. A potential difference between the initialization voltage Vint and the second voltage ELVSS applied to the cathode of the organic light emitting diode OLED may be less than a light emitting threshold voltage of the organic light emitting diode OLED.

Referring to FIGS. 2A and 2B, an operation of the ith pixel PXi will be described in more detail below. The organic light emitting display panel DP may display an image at each frame section. During each frame section, a plurality of scan signals may be sequentially scanned from a plurality of scan lines SL1 to SLn. FIG. 2B illustrates a portion of one frame section.

The i−1th scan signal Si−1 may be activated during a first initialization section RP1. In an exemplary embodiment of the present invention, when signals described with reference to FIG. 2A have a high level, the scan signals may be activated. A high level of signal described with reference to FIG. 2B may be a turn-on voltage of a transistor to which corresponding signals are applied.

As the fourth transistor T4 is turned on by the i−1th scan signal Si−1, the first voltage ELVDD may be applied to the first node N1. The ith scan signal Si may be activated during a data write section DIP defined after a first initialization section RP1. When the second transistor T2 and the third transistor T3 are turned on by the activated ith scan signal Si during the data write section DIP, the first transistor T1 may be diode-connected between the second transistor T2 and the third transistor T3.

The data signal Dk may be supplied to the kth data line DLk during the data write section DIP. The data signal Dk may be provided to the first node N1 via the second transistor T2, the first transistor T1, and the third transistor T3. At this point, since the second transistor T2 is in a diode-connected state, a voltage difference between the data signal Dk and a threshold voltage of the second transistor T2 may be provided to the first node N1. During the data write section DIP, a voltage difference between the first node N1 and the second node N2 may be stored in the capacitor Cst. The second node N2 may be initialized by the initialization voltage Vint in a previous frame.

The ith light emitting control signal Ei deactivated during the first initialization section RP1 and the data write section DIP may be activated during a light emitting section EP defined after the data write section DIP. The fifth transistor T5 and the sixth transistor T6 may be turned on by the ith light emitting control signal Ei, and a voltage charged in the capacitor Cst may be applied to the control electrode of the first transistor T1.

A current path may be formed by the ith light emitting control signal Ei bettween the power line PL and the organic light emitting diode OLED. Thus, the organic light emitting diode OLED may emit light during the light emitting section IP. The organic light emitting diode OLED may emit light with a brightness corresponding to a voltage charged to the capacitor Cst.

The ith scan signal Si may be activated during a second initialization section RP2 defined after the light emitting section EP. As the seventh transistor T7 is turned on by the i+1th scan signal Si+1, the initialization voltage Vint may be applied to the second node N2 and the anode of the organic light emitting diode OLED may be initialized by the initialization voltage Vint. The organic light emitting diode OLED may stop emitting light by the second initialization section RP2.

Referring to FIG. 2B, as an example, predetermined delay sections may exist between the first initialization section RP1, the data write section DIP, the light emitting section EP, and the second initialization section RP2; however, exemplary embodiments of the present invention are not limited thereto. In an exemplary embodiment of the present invention, the first initialization section RP1, the data write section DIP, the light emitting section EP, and the second initialization section RP2 may be continuous and might not include any delays therebetween.

Although a pixel PXi according to an exemplary embodiment of the present invention t is described with reference to FIGS. 2A and 2B, exemplary embodiments of the present invention are not limited thereto. The pixel PXi may include an organic light emitting diode and a switching transistor, a driving transistor, and a capacitor, as a driving circuit driving the organic light emitting diode. A pixel circuit is not limited to a particular arrangement. Although a control transistor including six transistors is described herein as an example, exemplary embodiments of the present invention are not limited thereto, and a control transistor may include less than or more than six thin film transistors.

Figure 3:
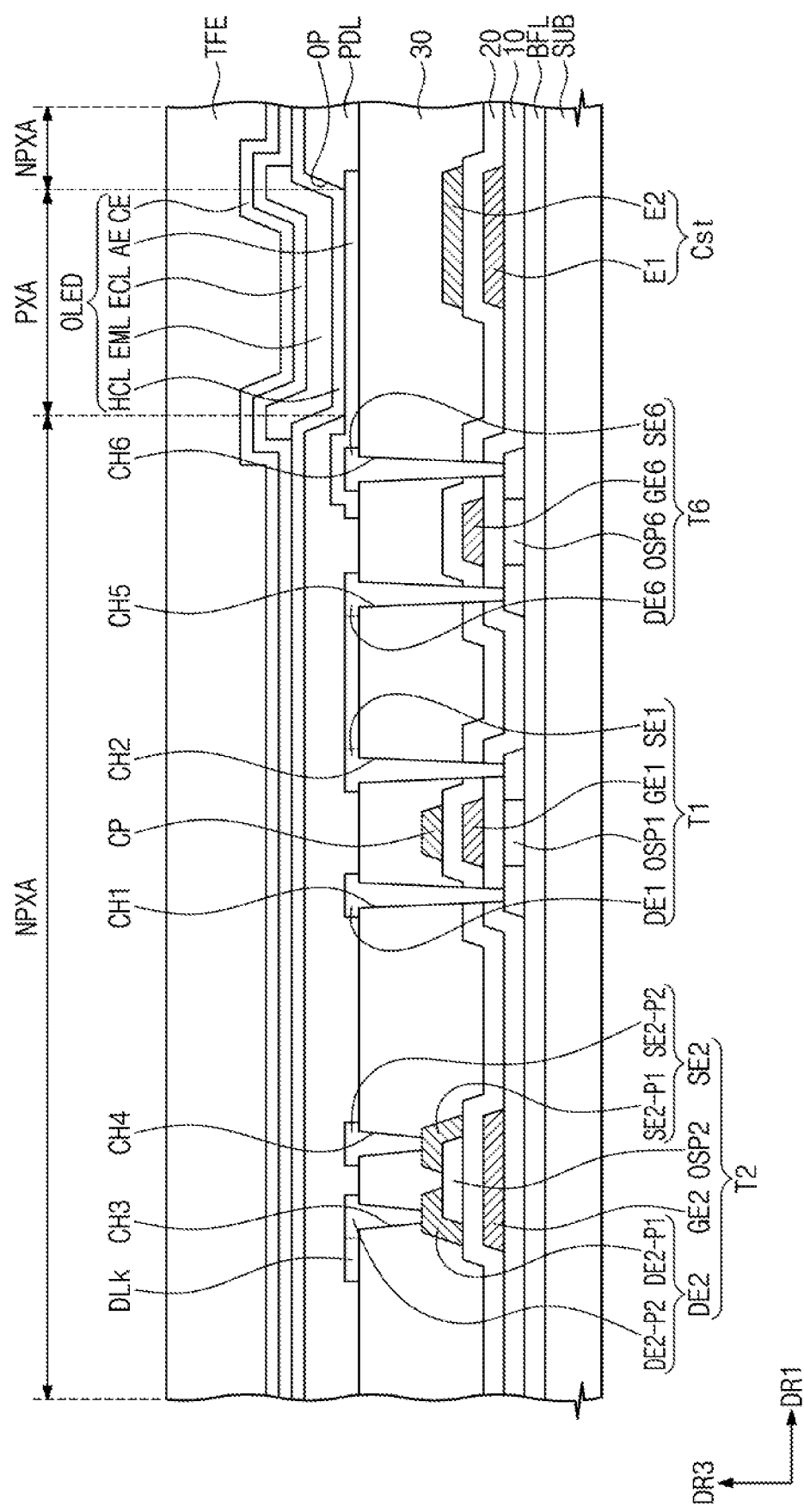
FIG. 3 is a cross-sectional view of a display device corresponding to a pixel according to an exemplary embodiment of the present invention.

FIG. 3 is a cross-sectional view of a display device corresponding to a pixel according to an exemplary embodiment of the present invention.

FIG. 3 illustrates a cross-section of a pixel including the first transistor T1, the second transistor T2, the sixth transistor T6, and the organic light emitting diode OLED of the equivalent circuit described with reference to FIG. 2A.

Referring to FIG. 3, the first transistor T1, the second transistor T2, the sixth transistor T6, and the organic light emitting diode OLED may be disposed above an upper surface of the base substrate SUB. The upper surface of the base substrate SUB may extend along the first direction DR1 (see, e.g., FIG. 1) and the second direction DR2. The base substrate SUB may include a plastic substrate, a glass substrate, or a metallic substrate. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, or perylene resin.

Each of the first transistor T1, the second transistor T2, and the sixth transistor T6 may include an input electrode, an output electrode, a control electrode, and a semiconductor pattern. Below, the terms "first," "second," and "sixth" preceding the terms input electrode, output electrode, control electrode, and semiconductor pattern may refer to the components of the first transistor T1, the second transistor T2, and the sixth transistor T6, respectively.

Referring to FIG. 3, as an example, the first transistor T1, the second transistor T2, and the sixth transistor T6 may be spaced apart from each other in the first direction DR1; however, exemplary embodiments of the present invention are not limited thereto. For example, when a first input electrode DE1 and a first output electrode SE1 of the first transistor T1 are spaced apart from each other in the first direction DR1, a second input electrode DE2 and a second output electrode SE2 of the second transistor T2 may be spaced apart from each other in another direction along the upper surface of the base substrate SUB interesting the first direction DR1.

A buffer layer BFL may be disposed on the upper surface of the base substrate SUB. The buffer layer BFL may increase the coupling strength of the base substrate SUB and conductive patterns or semiconductor patterns. The buffer layer BFL may include an inorganic layer. A barrier layer may be disposed on the upper surface of the base substrate SUB. The barrier layer and/or the buffer layer BFL may reduce or prevent a penetration of foreign materials. The buffer layer BFL and the barrier layer may be included or omitted, as desired. Light shielding patterns overlapping a first control electrode GE1, a second control electrode GE2, and a sixth control electrode GE6 may be disposed between the base substrate SUB and the buffer layer BFL.

A first semiconductor pattern OSP1 and a sixth semiconductor pattern OSP6 may be disposed on the buffer layer BFL. Each of the first semiconductor pattern OSP1 and the sixth semiconductor pattern OSP6 may include polysilicon. However, exemplary embodiments of the present invention are not limited thereto, and each of the first semiconductor pattern OSP1 and the sixth semiconductor pattern OSP6 may include amorphous silicon.

Each of the first semiconductor pattern OSP1 and the sixth semiconductor pattern OSP6 may include an input area, an output area, and a channel area defined between the input area and the output area. Channel areas of the first semiconductor pattern OSP1 and the sixth semiconductor pattern OSP6 may be defined in positions corresponding to the first control electrode GE1 and the sixth control electrode GE6. The input area and the output area may be doped with a dopant and thus the input area and the output area may each have a relatively high conductivity compared to the channel area. The input area and the output area may be doped with an n-type dopant.

A first insulation layer 10 (e.g., a first interlayer insulation layer) may be disposed on the buffer layer BFL. The first interlayer insulation layer 10 may overlap the plurality of pixels PX and may substantially cover the first semiconductor pattern OSP1 and the sixth semiconductor pattern OSP6. The first interlayer insulation layer 10 may be an inorganic layer or an organic layer and may have a single layer structure or multilayer structure. The first interlayer insulation layer 10 may include at least one of aluminum oxide, titanium oxide, silicon oxide, silicon oxynitride, zirconium oxide, or hafnium oxide.

The first control electrode GE1 the second control electrode GE2, the sixth control electrode GE6, and a first electrode E1 of the capacitor Cst may be disposed on the lust interlayer insulation layer 10. The first control electrode GE1 and the sixth control electrode GE6 may overlap the channel area of the first semiconductor pattern OSP1 and the channel area of the sixth semiconductor pattern OSP6, respectively. The first electrode E1 may be connected to the first control electrode GE1.

A second insulation layer 20 (e.g., a second interlayer insulation layer) substantially covering the first control electrode GE1, the second control electrode GE2, the sixth control electrode GE6, and the first electrode E1 may be disposed on the first interlayer insulation layer 10. The second interlayer insulation layer 20 may commonly overlap each of the plurality of pixels PX. The second interlayer insulation layer 20 may be an inorganic layer or an organic layer and may have a single layer or multilayer structure. The second interlayer insulation layer 20 may include at least one of aluminum oxide, titanium oxide, silicon oxide, silicon oxynitride, zirconium oxide, or hafnium oxide. The second interlayer insulation layer 20 may include silicon nitride, and may be a layer having a relatively high dielectric constant relative to a thickness of the layer. Thus, the capacitance of the capacitor Cst may be increased.

A second semiconductor pattern OSP2 and a second electrode E2 of the capacitor Cst may be disposed on the second interlayer insulation layer 20. The second semiconductor pattern OSP2 may include an oxide semiconductor. The oxide semiconductor may include ITO, IGZO, ZnO, IZnO, ZIO, InO, TiO, IZTO, or ZTO.

The second semiconductor pattern OSP2 may include a crystalline oxide semiconductor. The crystalline oxide semiconductor may be crystallized in a vertical direction DR3. Referring to FIG. 3, the vertical direction DR3 may be a third direction DR3, which may refer to a normal direction of the upper surface of the base substrate SUB. A vertical crystalline oxide semiconductor may be defined as an oxide semiconductor having a growth axis of the normal direction of a channel. The vertical crystalline oxide semiconductor may be defined as a c-axis aligned crystal oxide semiconductor. The second semiconductor pattern OSP2 may be partially crystallized. Thus, the second semiconductor pattern OSP2 may include an amorphous oxide semiconductor.

Conductive patterns may be disposed on the second interlayer insulation layer 20. The conductive patterns may be formed through the same process as the second electrode E2. As an example, the conductive patterns may include the same material and may have substantially the same layered structure as the second electrode E2.

The conductive patterns may include a lower portion DE2-P1 of the second input electrode DE2 and a lower portion SE2-P1 of the second output electrode SE2. The lower portion DE2-P1 of the second input electrode DE2 and the lower portion SE2-P1 of the second output electrode SE2 may be in direct contact with an upper surface of the second semiconductor pattern OSP2. Each of the lower portion DE2-P1 of the second input electrode DE2 and the lower portion SE2-P1 of the second output electrode SE2 may include a portion overlapping the second semiconductor pattern OSP2 and a portion not overlapping the second semiconductor pattern OSP2 on a plane. The portion not overlapping the second semiconductor pattern OSP2 may be in direct contact with the second interlayer insulation layer 20.

An ohmic contact may be defined in areas that contact the lower portion DE2-P1 of the second input electrode DE2 and the lower portion SE2-P1 of the second output electrode SE2 of the second semiconductor pattern OSP2. An area exposed to the lower portion DE2-P1 of the second input electrode DE2 and the lower portion SE2-P1 of the second output electrode SE2 of the second semiconductor pattern OSP2 may be defined as a channel area. The second semiconductor pattern OSP2 may include a channel area disposed between an input area and an output area, and each of the input area and the output area may be doped with an n-type dopant. The lower portion DE2-P1 of the second input electrode DE2 and the lower portion SE2-P1 of the second output electrode SE2 may control the channel length and channel width of the second transistor T2.

One conductive pattern CP among the conductive patterns may overlap the first control electrode GE1. The one conductive pattern CP may be connected to the second electrode E2.

A third insulation layer 30 (e.g., an upper insulation layer) may be disposed on the second interlayer insulation layer 20. The upper insulation layer 30 may have a single layer structure or a multilayer structure. The upper insulation layer 30 may include an organic layer and/or an inorganic layer.

At least one upper insulation layer 30 may include at least one of aluminum oxide, titanium oxide, silicon oxide, silicon oxynitride, zirconium oxide, or hafnium oxide as an inorganic layer. When an inorganic layer substantially covers the exposed channel area of the second semiconductor pattern OSP2, damage to the channel of the second semiconductor pattern OSP2 (e.g., due to exposure to an organic material) may be reduced or prevented.

The upper insulation layer 30 may have a greater thickness compared to the first interlayer insulation layer 10 and the second interlayer insulation layer 20. Thus, an interference of the data line DLk and the second control electrode GE2 may be prevented. The upper insulation layer 30 may provide a relatively flat upper surface compared to the first interlayer insulation layer 10 and the second interlayer insulation layer 20.

The first input electrode DE1, the first output electrode SE1, the second input electrode DE2, the second output electrode SE2, the data line DLk, an upper portion DE2-P2 of the second input electrode DE2, and an upper portion SE2-P2 of the second output electrode SE2 may be disposed on the upper insulation layer 30. Through a first contact hole CH1 and a second contact hole CH2 that respectively expose the input area and the output area of the first semiconductor pattern OSP1, the first input electrode DE1 and the first output electrode SE1 may be connected to the first semiconductor pattern OSP1. Through a fifth contact hole CH5 and a sixth contact hole CH6 that respectively expose the input area and the output area of the sixth semiconductor pattern OSP6, the sixth input electrode DE6 and the sixth output electrode SE6 may be connected to the sixth semiconductor pattern OSP6. The first contact hole CH1, the second contact hole CH2, the fifth contact hole CH5, and the sixth contact hole CH6 may penetrate the first interlayer insulation layer 10, the second interlayer insulation layer 20, and the upper insulation layer 30. The first output electrode SE1 and the sixth input electrode DE6 may be connected to the upper insulation layer 30.

Through a third contact hole CH3 and a fourth contact hole CH4 that respectively expose the lower portion DE2-P1 of the second input electrode DE2 and the lower portion SE2-P1 of the second output electrode SE2, the upper portion DE2-P2 of the second input electrode DE2 and the upper portion SE2-P2 of the second output electrode SE2 may be respectively connected to the lower portion DE2-P1 of the second input electrode DE2 and the lower portion SE2-P1 of the second output electrode SE2. The third contact hole CH3 and the fourth contact hole CH4 may penetrate the upper insulation layer 30.

A pixel definition layer PDL and an organic light emitting diode OLED may be disposed on the upper insulation layer 30. As an example, the pixel definition layer PDL and the organic light emitting diode OLED may be in direct contact with the upper insulation layer 30, which may be a single layer; however, exemplary embodiments of the present invention are not limited thereto. As an example, an organic layer may be disposed on the upper insulation layer 30.

An anode AE may be disposed on the upper insulation layer 30. The anode AE may be directly connected to the sixth output electrode. An opening part OP of the pixel definition layer PDL may expose at least a part of the anode AE.

The opening part OP of the pixel definition layer PDL may define a light emitting area PXA of the pixel PXi. For example, the plurality of pixels PX may be arranged on the plane of the display panel DP to have a predetermined configuration. An area where the plurality of pixels PX is disposed may be defined as a pixel area and one pixel area may include the light emitting area PXA and a non-light emitting area NPXA adjacent to the light emitting area PXA. The non-light emitting area NPXA may substantially surround the light emitting area PXA.

A hole control layer HCL may be disposed in the light emitting area PXA and the non-light emitting area NPXA. A layer, such as a hole control layer HCL, may be positions in each of the plurality of pixels PX. The hole control layer HCL may include a hole transport layer and a hole injection layer.

An organic light emitting layer EML may be disposed on the hole control layer HCL. The organic light emitting layer EML may be disposed in an area corresponding to the opening part OP. As an example, an organic light emitting layer EML may be positioned in each of the plurality of pixels PX.

An electronic control layer ECL may be disposed on the organic light emitting layer EML. The electron control layer ECL may include an electron transport layer and an electron injection layer. A cathode CE may be disposed on the electronic control layer ECL. A cathode CE may be positioned in each of the plurality of pixels PX.

A thin film sealing layer TFE may be disposed OD the cathode CE. A thin film sealing layer TFE may be positioned in each of the plurality of pixels PX. The thin film sealing layer TFE may include at least two inorganic layers and an organic layer therebetween. The thin film sealing layer TFE may include a plurality of inorganic layers and a plurality of organic layers, which may be alternatively and repeatedly stacked.

An organic light emitting layer EML may be positioned in each of the plurality of pixels PX. The organic light emitting layer EML may generate white light. The organic light emitting layer EML may have a multilayer structure.

According to an exemplary embodiment of the present invention, the thin film sealing layer TFE may substantially cover the cathode CE and may be in direct contact with the cathode CE. According to an exemplary embodiment of the present invention, a capping layer may substantially the cathode CE. The thin film sealing layer TFE may substantially cover the capping layer, and may be in direct contact with the capping layer.

Referring to FIG. 3, the first transistor T1 and the sixth transistor T6 may include a polysilicon semiconductor, and thus the first transistor T1 and the sixth transistor T6 may have relatively high electron mobility. The second interlayer insulation layer 20, which may be a gate insulation layer in the second transistor T2, may be relatively thin, and thus, a turn-on current speed and reliability of the second transistor T2 may be increased. The upper insulation layer 30 may be relatively thick, and thus a signal interference by the data line DLk may be reduced or eliminated.

Figure 4:
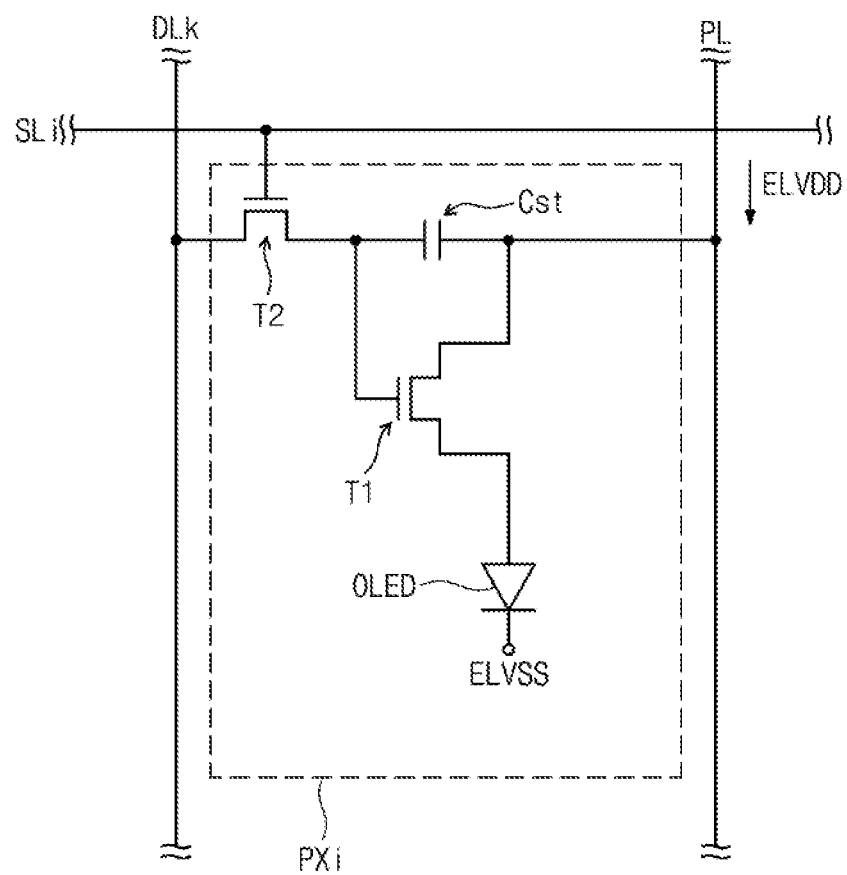
FIG. 4 is an equivalent circuit diagram of a pixel according to an exemplary embodiment of the present invention.
Figure 5:
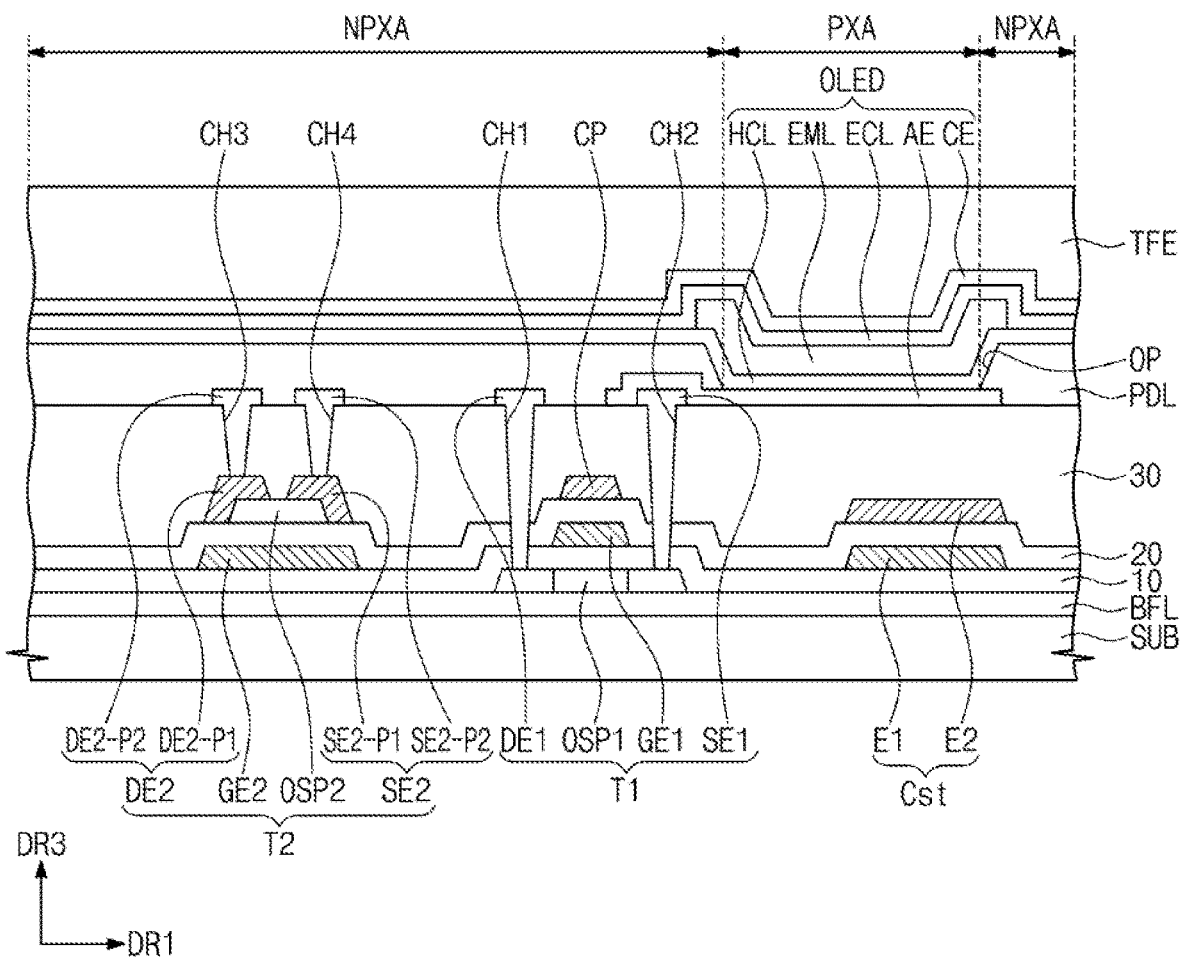
FIG. 5 is a cross-sectional view of a display device corresponding to a pixel according to an exemplary embodiment of the present invention.

FIG. 4 is an equivalent circuit diagram of a pixel according to an exemplary embodiment of the present invention. FIG. 5 is a cross-sectional view of a display device corresponding to a pixel according to an exemplary embodiment of the present invention.

The pixel PXi may include an organic light emitting diode OLED as a display element. The organic light emitting diode OLED may be a front light-emitting-type diode or a rear-light-emitting-type diode. The pixel PXi may include the first transistor T1 (e.g., a driving transistor), the second transistor T2 (e.g., a switching transistor), and the capacitor Cst, which may be a driving circuit driving the organic light emitting diode OLED.

The second transistor T2 may output a data signal applied to the kth data line DLk in response to a scan signal applied to the ith scan signal SLi. The capacitor Cst may store s a voltage corresponding to a data signal received from the second transistor T2.

The first transistor T1 may control a driving current flowing through the organic light emitting diode OLED in correspondence to a charge (e.g., voltage) amount stored in the capacitor Cst. The organic light emitting device OLED may emit light during a turn-on section of the first transistor T1.

Referring to FIG. 5, a connection relationship between the first transistor T1 and the organic light emitting device OLED may be different than in the display device described with reference to FIG. 3. The first transistor T1 may be indirectly connected to the anode AE via the sixth transistor T6, as described with reference to FIG. 3; however, the output electrode SE1 of the first transistor T1 may be directly connected to the anode AE in the organic light emitting device OLED described with reference to FIG. 5.

As described with reference to FIGS. 2A to 5, a configuration of a driving circuit in a pixel may be modified, as desired. However, even if a configuration of a driving circuit in a pixel is modified, the sectional structures of the first transistor T1, the second transistor T2, and the capacitor Cst may remain substantially the same.

FIGS. 6A to 6G are cross-sectional views illustrating a method of manufacturing a display device according to an exemplary embodiment of the present invention.

Although a description is made with reference to FIG. 5 below, the same description may be substantially identically applied to the display device described herein with reference to FIG. 3. However, in relation to the display device described with reference to FIG. 3, the sixth transistor T6 may be formed through the same process as the first transistor T1. The third to fifth transistors T3 to T5 and the seventh transistor T7 described with reference to FIG. 2A may be formed through the same process as the first transistor T1 or the sixth transistor T6.

Figure 6A:
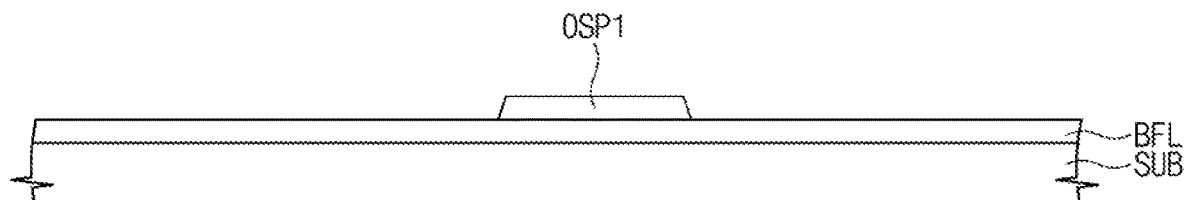
FIGS. 6A to 6G are cross-sectional views illustrating a method of manufacturing a display device according to an exemplary embodiment of the present invention.
Figure 6A:
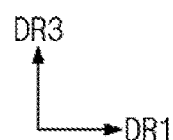

Referring to FIG. 6A, the buffer layer BFL may be formed on an upper surface of the base substrate SUB. The buffer layer BFL may be formed by deposition, coating, or printing an inorganic material. The first semiconductor pattern OSP1 may be formed in a partial area of the buffer layer BFL. After a semiconductor layer is formed on the entire upper surface of the buffer layer BFL, it may be patterned through a photolithography process. The first semiconductor pattern OSP1 may include polysilicon. As an example, a crystallization operation may be performed.

Figure 6B:
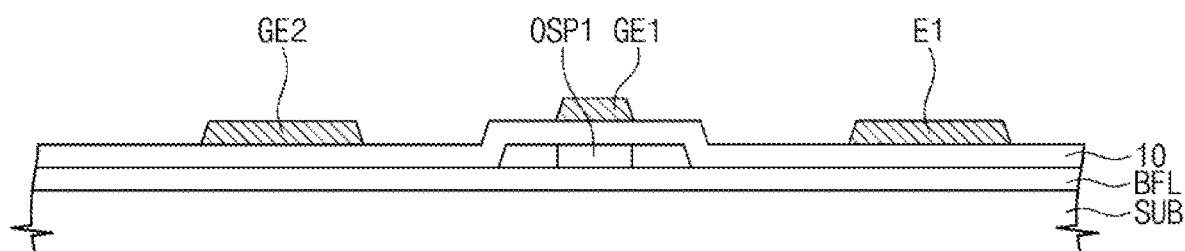
Figure 6B:
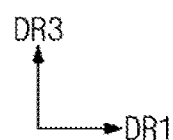

Referring to FIG. 6B, the first interlayer insulation layer 10 substantially covering the first semiconductor pattern OSP1 may be formed on the buffer layer BFL. The first interlayer insulation layer 10 may be formed by depositing, coating, or printing an inorganic material or an organic material. The first control electrode GE1 overlapping the first semiconductor pattern OSP1 and the second control electrode GE2 not overlapping the first semiconductor patter OSP1 may be formed on the first interlayer insulation layer 10.

After a conductive layer is formed on the first interlayer insulation layer 10, by patterning the conductive layer through a photolithography process, the first control electrode GE1 and the second control electrode GE2 may be formed. The first control electrode GE1 may be disposed at the inner side of the first semiconductor pattern OSP1 in the first direction DR1. The first electrode E1 of the capacitor Cst may be formed through the same process.

The first semiconductor pattern OSP1 may be doped with a dopant. During a doping process, the first control electrode GE1 may function as a mask. An area (e.g., a channel area) overlapping the first control electrode GE1 may be substantially undoped and areas (e.g., an input area and an output area) on opposite sides of a channel area may be doped. Doping may be performed by using an n-type dopant, such as, a pentavalent element.

Figure 6C:
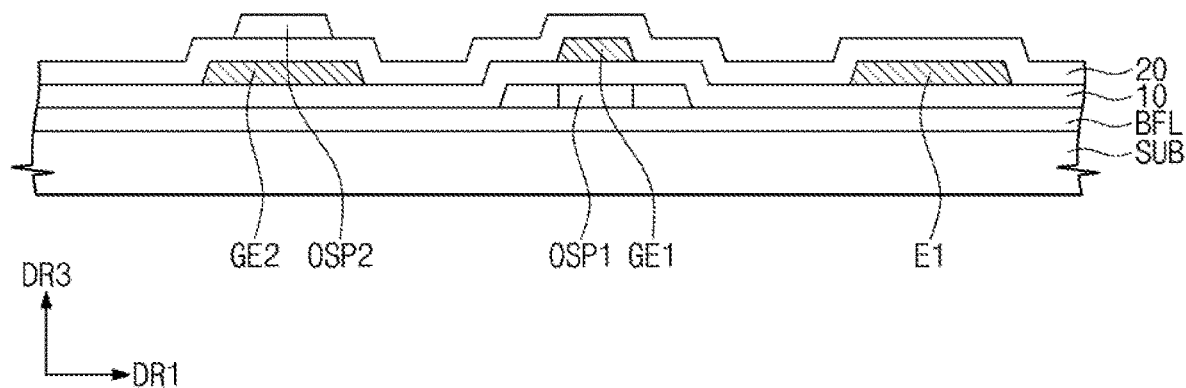

Referring to FIG. 6C, a second interlayer insulation layer 20 covering the first control electrode GE1, the second control electrode GE2, and the first electrode E1 may be formed on the first interlayer insulation layer 10. The second interlayer insulation layer 20 may be formed by depositing an inorganic material, or depositing, coating, or printing an organic material.

A second semiconductor pattern OSP2 may be formed on the second interlayer insulation layer 20. After a semiconductor layer is formed on substantially the entire upper surface of the second interlayer insulation layer 20, it may be patterned through a photolithography process.

The second semiconductor pattern OSP2 may include an oxide semiconductor. The second semiconductor pattern OSP2 may include an amorphous oxide semiconductor or a crystalline oxide semiconductor. The crystalline oxide semiconductor may be formed by performing an additional crystallization process or may be formed by controlling a process condition for forming an oxide semiconductor layer.

Figure 6D:
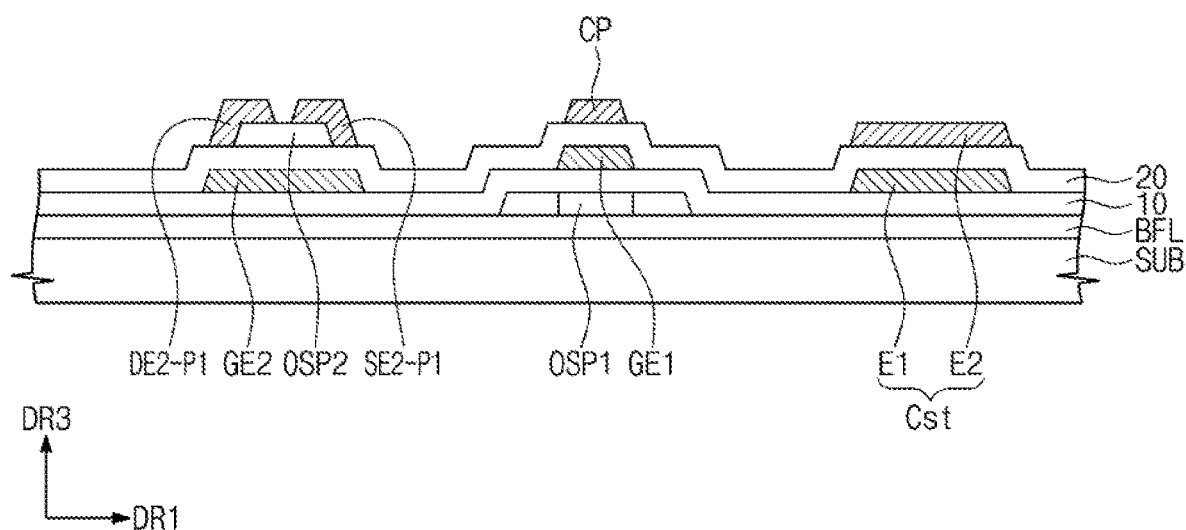

Referring to FIG. 6D, conductive patterns may be formed on the second interlayer insulation layer 20. After a conductive layer is formed on the second interlayer insulation layer 20 through a deposition process, a coating process, or a printing process, it may be patterned through a photolithography process. Thus, a lower portion DE2-P1 of the second input electrode and a lower portion SE2-P1 of the second output electrode connected to the second semiconductor pattern OSP2 may be formed. A conductive pattern CP overlapping the first control electrode GE1 and a second electrode E2 of the capacitor Cst may be formed substantially simultaneously together with the lower portion DE2-P1 of the second input electrode.

Figure 6E:
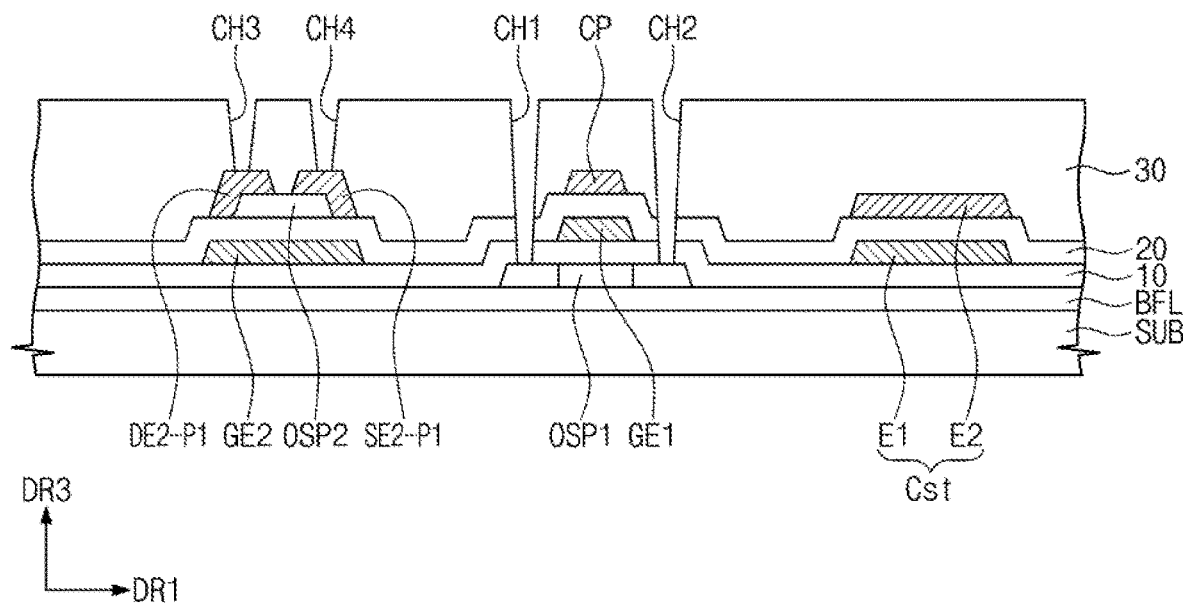

Referring to FIG. 6E, an upper insulation layer 30 may be formed on the second interlayer insulation layer 20. The upper insulation layer 30 may be formed by depositing an inorganic material, or depositing, coating, or printing an organic material.

First to fourth contact holes CH1 to CH4 may be formed through a photolithography process. The first contact hole CH1 and the second contact hole CH2 may respectively expose the input area and the output area of the first semiconductor pattern OSP1. The first contact hole CH1 and the second contact hole CH2 may penetrate the first interlayer insulation layer 10, the second interlayer insulation layer 20, and the upper insulation layer 30. The third contact hole CH3 and the fourth contact hole CH4 may respectively expose the input area and the output area of the second semiconductor pattern OSP2.

Figure 6F:
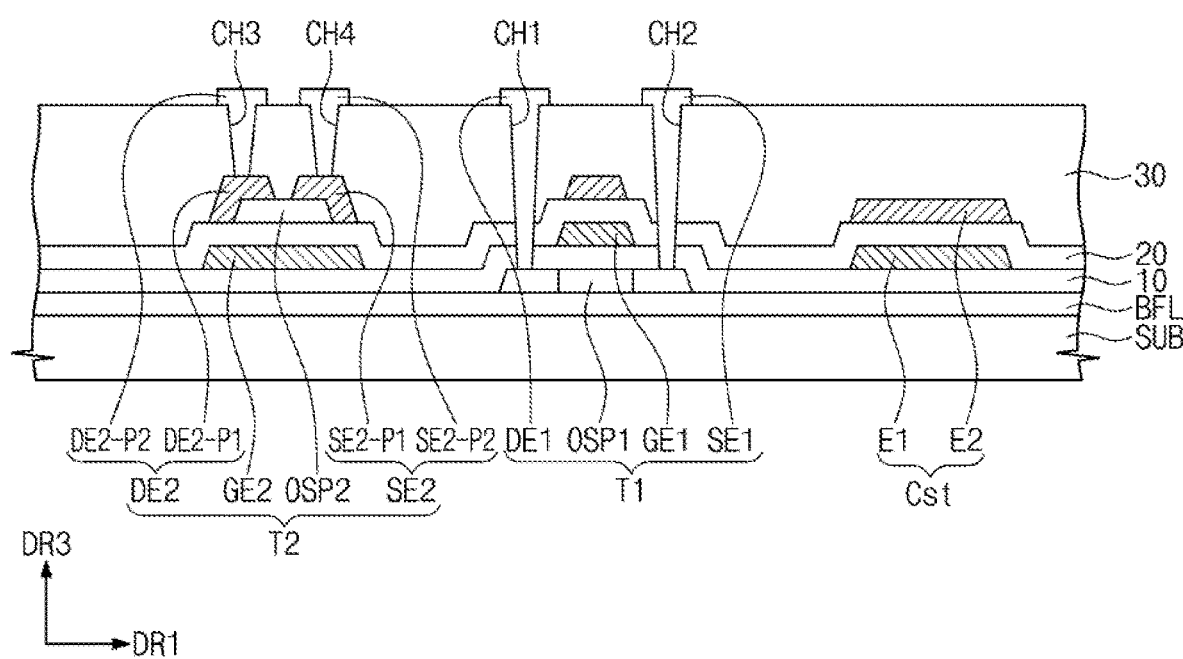

Referring to FIG. 6F, conductive patterns may be formed on the upper insulation layer 30. After a conductive layer is formed on the upper insulation layer 30 through a deposition process, a coating process, or a printing process, it may be patterned through a photolithography process. A first input electrode DE1 and a first output electrode SE1 respectively connected to the input area and the output area of the first semiconductor pattern OSP1 via the first contact hole CH1 and the second contact hole CH2 may be formed. An upper portion DE2-P2 of the second input electrode DE2 and an upper portion SE2-P2 of the second output electrode SE2 that are respectively connected to the lower portion DE2-P1 of the second input electrode and the lower portion SE2-P1 of the second output electrode via the third contact hole CH3 and the fourth contact hole CH4 may be formed.

Figure 6G:
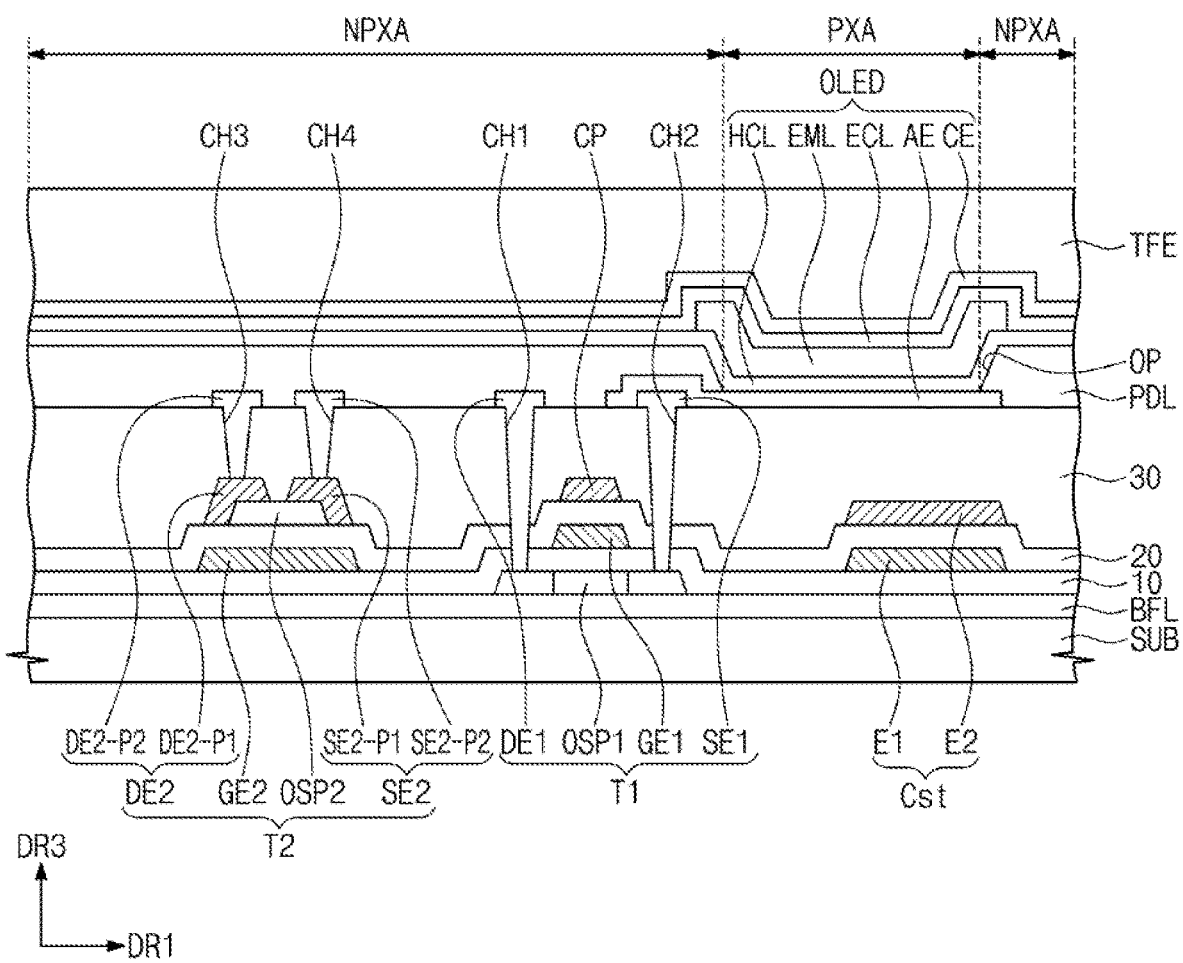

Referring to FIG. 6G, a pixel definition layer PDL, an organic light emitting diode OGLED, and a thin film sealing layer TFE may be formed on the upper insulation layer 30. An anode AE may be formed on the upper insulation layer 30. The pixel definition layer PDL having an opening pan that exposes the anode AE may be formed. Then, a plurality of layers may be formed through a plurality of iterations of a deposition process, a coating process, or a printing process. Additionally, a specific layer may be patterned through a photolithography process. Through such processes, the organic light emitting diode OLED and the thin film sealing layer TFE may be formed.

Figure 7:
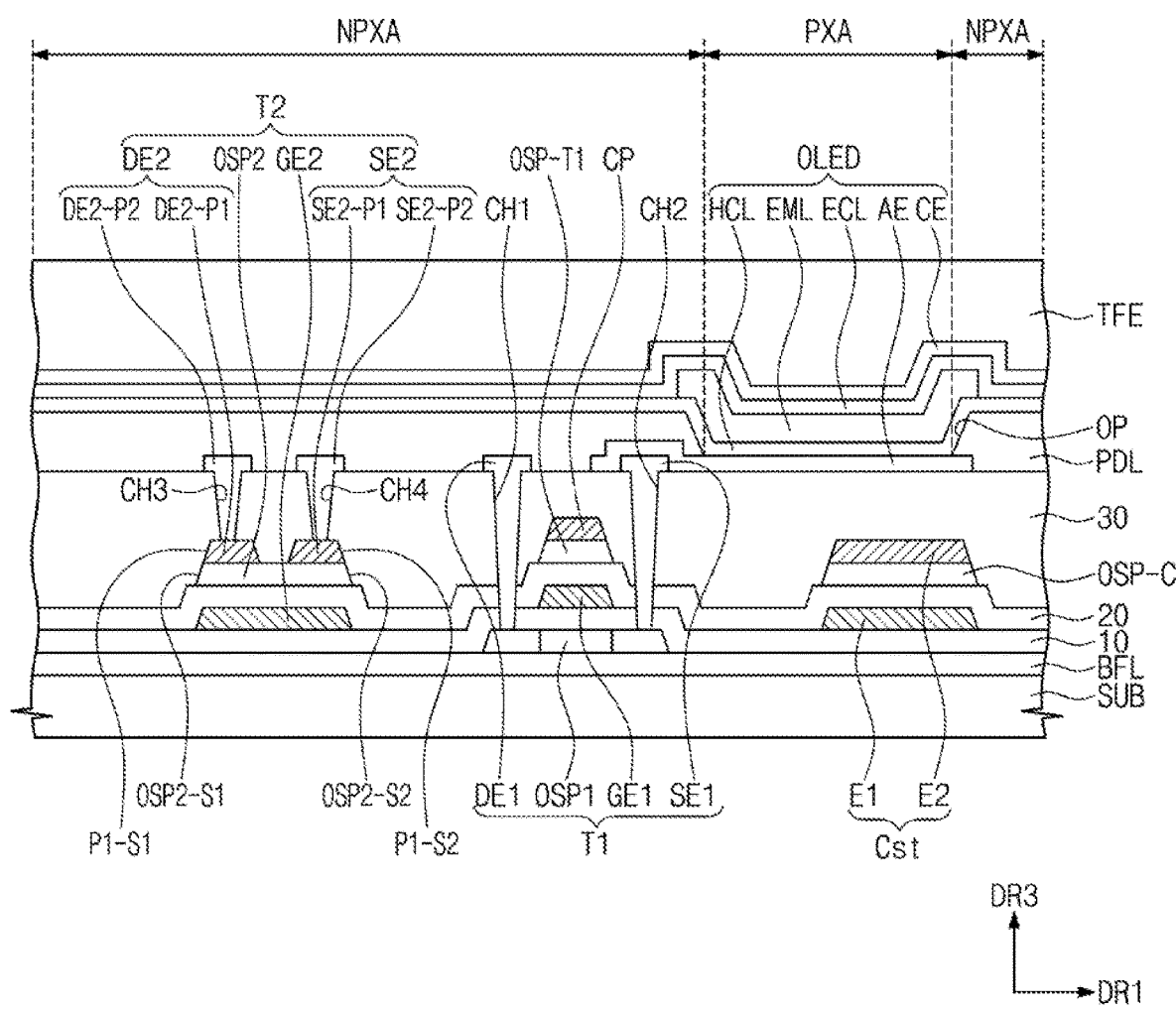
FIG. 7 is a cross-sectional view of a display device according to an exemplary embodiment of the present invention.

FIG. 7 is a cross-sectional view of a display device according to an exemplary embodiment of the present invention. FIGS. 8A to 8F are cross-sectional views illustrating a method of manufacturing a display device according to an exemplary embodiment of the present invention.

A method of manufacturing a display device according to an exemplary embodiment of the present invention will be described in more detail below with reference to FIG. 7 and FIGS. 8A to 8F, The method described below may be substantially the same as the method described above with reference FIG. 5 and FIGS. 6A to 6G, and thus duplicative descriptions may be omitted and differences between the methods may be focused on.

Referring to FIG. 7, the lower portion DE2-P1 of the second input electrode DE2 and the lower portion SE2-P1 of the second output electrode SE2 may be disposed at the inner side of the second semiconductor pattern OSP2. The lower portion DE2-P1 of the second input electrode DE2 and the lower portion SE2-P1 of the second output electrode SE2 may be spaced apart from each other in the first direction DR1. The lower portion DE2-P1 of the second input electrode DE2 and the lower portion SE2-P1 of the second output electrode SE2 may be disposed at the inner side of the second semiconductor pattern OSP2 on a plane.

As an example, the lower portion DE2-P1 of the second input electrode DE2 and the lower portion SE2-P1 of the second output electrode SE2 may overlap the second semiconductor pattern OSP2. The lower portion DE2-P1 of the second input electrode DE2 and the lower portion SE2-P1 of the second output electrode SE2 might not be in direct contact with the second interlayer insulation layer 20.

An outer surface P1-S1 of the lower portion DE2-P1 of the second input electrode DE2 may be aligned with a first outer surface OSP2-S1 of the second semiconductor pattern OSP2 and an outer surface P1-S2 of the lower portion SE2-P1 of the second output electrode SE2 may be aligned with a second outer surface OSP2-S2 of the second semiconductor pattern OSP2. As an example, the outer surface P1-S1 of the lower portion DE2-P1 of the second input electrode DE2 may be aligned with the first outer surface OSP2-S1 of the second semiconductor pattern OSP2 and the outer surface P1-S2 of the lower portion SE2-P1 of the second output electrode SE2 may be aligned with the second outer surface OSP2-S2 of the second semiconductor pattern OSP2 by being respectively etched through the same etch processes.

The first outer surface OSP2-S1 of the second semiconductor pattern OSP2 and the second outer surface OSP2-S2 of the second semiconductor pattern OSP2 may face each other in the first direction DR1. The inner surface of the lower portion DE2-P1 of the second input electrode DE2 and the inner surface of the lower portion SE2-P1 of the second output electrode SE2 may be spaced apart from each other in the first direction DR1. A distance between the inner surface of the lower portion DE2-P1 of the second input electrode DE2 and the inner surface of the lower portion SE2-P1 of the second output electrode SE2 may be substantially identical to the channel length of the second semiconductor pattern OSP2.

Referring to FIG. 7, a dummy semiconductor pattern OSP-C may be disposed between the second electrode E2 and the second interlayer insulation layer 20. A dummy semiconductor pattern OSP-T1 may be disposed between the conductive pattern C and the second interlayer insulation layer 20.

The dummy semiconductor patterns OSP-C and OSP-T1 and the second semiconductor patterns OSP2 may include a same semiconductor material. The dummy semiconductor patterns OSP-C and OSP-T1 and the second semiconductor patterns OSP2 may include an oxide semiconductor.

The dummy semiconductor patterns OSP-C and OSP-T1 and the second semiconductor patterns OSP2 may be formed through a same process, and thus the dummy semiconductor patterns OSP-C and OSP-T1 and the second semiconductor patterns OSP2 may have substantially the same characteristics as each other. For example, the dummy semiconductor patterns OSP-C and OSP-T1 and the second semiconductor patterns OSP2 may include a vertical crystalline oxide semiconductor.

Each of the dummy semiconductor patterns OSP-C and OSP-T1 may be a dielectric layer or a conductive layer. Each of the dummy semiconductor patterns OSP-C and OSP-T1 may include a semiconductor material having a relatively high dielectric constant. Thus, the dummy semiconductor patterns OSP-C and OSP-T1 may have a dielectric property The dummy semiconductor pattern OSP-C may increase the capacitance of the capacitor Cst.

The dummy semiconductor patterns OSP-C and OSP-T1 and the second semiconductor patterns OSP2 may be doped with an n-type dopant. Thus, the dummy semiconductor patterns OSP-C and OSP-T1 and the second semiconductor patterns OSP2 may each be electrically conductive. However, the channel area of the second semiconductor pattern OSP2 might not be electrically conductive. The dummy semiconductor patterns OSP-C and OSP-T1 and the second semiconductor patterns OSP2 will be described in more detail below.

Figure 8A:
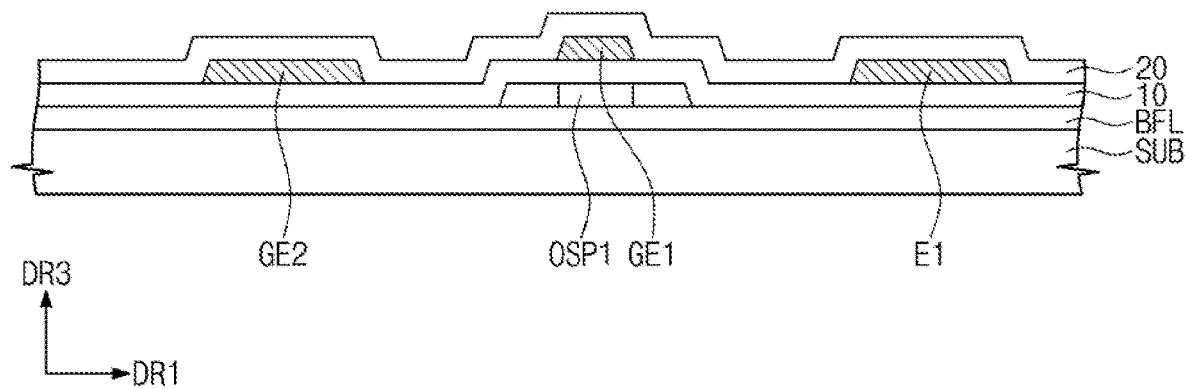
FIGS. 8A to 8F are cross-sectional views illustrating a method of manufacturing a display device according to an exemplary embodiment of the present invention.

Referring to FIG. 8A, the buffer layer BFL, the first semiconductor pattern OSP1, the first interlayer insulation layer 10, the first control electrode GE1, the second control electrode GE2, the first electrode E1, and the second interlayer insulation layer 20 may be formed on the base substrate SUB. The processes described with reference to FIG. 8A may be substantially identical to those described with reference to FIGS. 6A to 6C, and thus duplicative descriptions may be omitted.

Figure 8B:
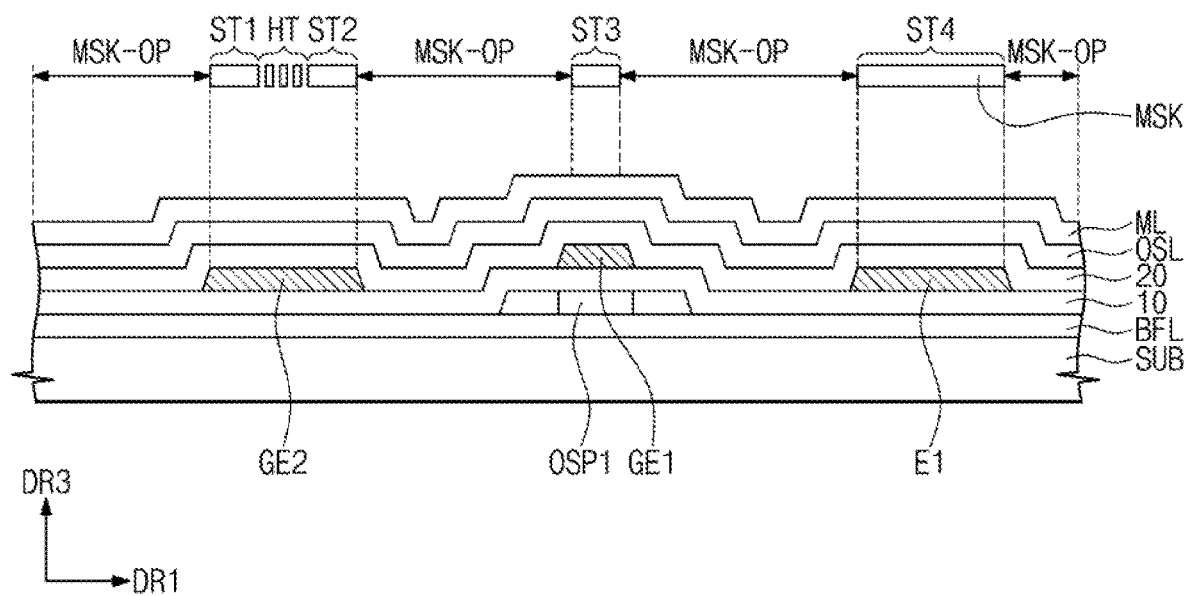

Referring to FIG. 8B, a semiconductor layer OSL and a conductive layer ML may be formed on the second interlayer insulation layer 20. After the forming of the semiconductor layer OSL, the conductive layer ML may be directly formed on the semiconductor layer OSL. The semiconductor layer OSL may include an oxide semiconductor. After the terming of the semiconductor layer OSL, a doping process may be performed. For example, an electrically conductive semiconductor layer doped with an n-type dopant may be doped on the semiconductor layer OSL.

The conductive layer ML and the semiconductor layer OSL may be patterned at substantially the same time. For example, a half-tone mask MSK may be used as a patterning mask. The half-tone mask MSK may include a first light shielding portion ST1 in a position corresponding to the lower portion DE2-P1 of the second input electrode DE2, a second light shielding portion ST2 in a position corresponding to the lower portion SE2-P1 of the second output electrode SE2, and a semi-transparent portion HT disposed between the first light shielding portion ST1 and the second light shielding portion ST2. A plurality of slits may be defined in the semi-transparent portion HT. The half-tone mask MSK may include a third light shielding portion ST3 in a position corresponding to the first control electrode GE1 and a fourth light shielding portion ST4 in a position corresponding to the second electrode E2. The half-tone mask MSK may include a plurality of light transmitting portions MSK-OP configured to transmit light.

Figure 8C:
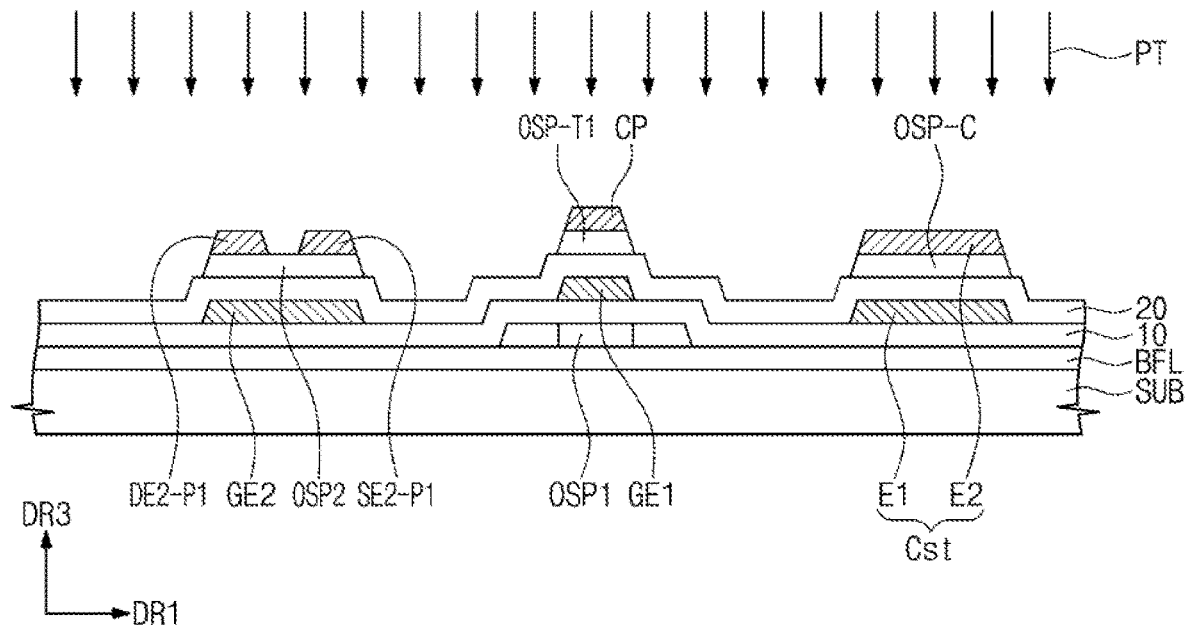

Referring to FIG. 8B and FIG. 8C, when the conductive layer ML and the semiconductor layer OSL are patterned at substantially the same time, a second semiconductor pattern OSP2, dummy semiconductor patterns OSP-T1 and OSP-C, a lower portion DE2-P1 of a second input electrode DE2, and a lower portion SE2-P1 of a second output electrode SE2 may be formed on the second insulation layer 20. Each of the lower portion DE2-P1 of the second input electrode DE2, the lower portion SE2-P1 of the second output electrode SE2, the conductive pattern CP, and the second electrode E2 may be disposed on corresponding semiconductor patterns among the second semiconductor pattern OSP2 and the dummy semiconductor patterns OSP-T1 and OSP-C. Thus, each of the lower portion DE2-P1 of the second input electrode DE2, the lower portion SE2-P1 of the second output electrode SE2, the conductive pattern CP, and the second electrode E2 might not be in direct contact with the second interlayer insulation layer 20.

A substantially central area of the second semiconductor pattern OSP2 may be exposed by the lower portion DE2-P1 of the second input electrode DE2 and the lower portion SE2-P1 of the second output electrode SE2. The substantially central area may be removed by plasma processing thus forming a channel area and thus electrical conductivity of the substantially central area of the second semiconductor pattern OSP2 may be removed. The exposed substantially central area of the second semiconductor pattern OSP2 may be deactivated by using N2 gas as plasma gas PT.

The plasma processing may be selectively performed, as desired. For example, the semiconductor layer OSL is not doped, plasma processing may be omitted.

Figure 8D:
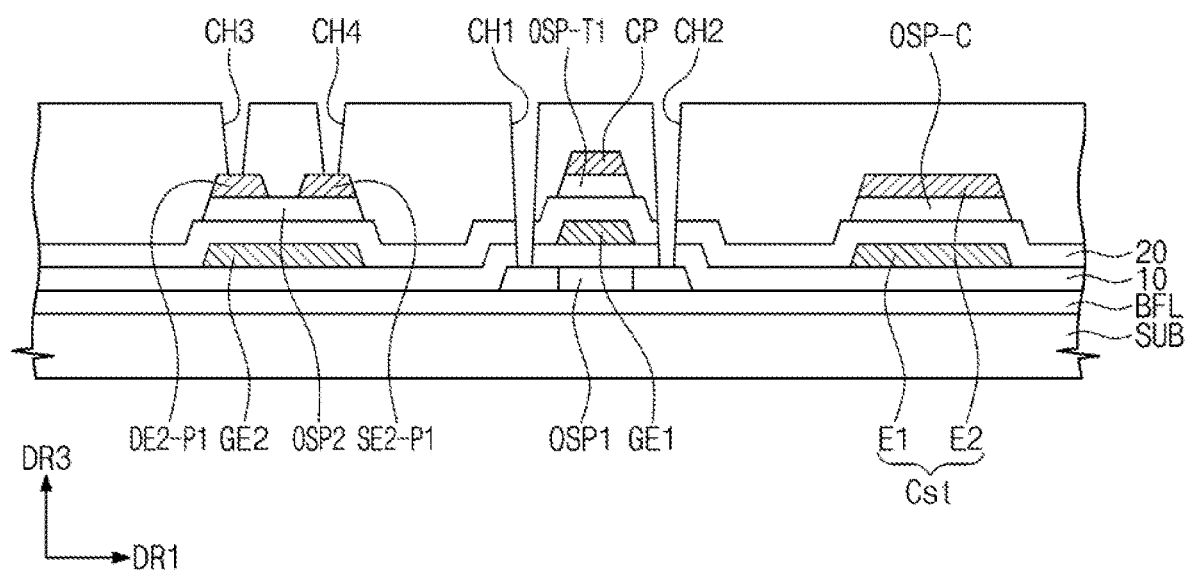
Figure 8E:
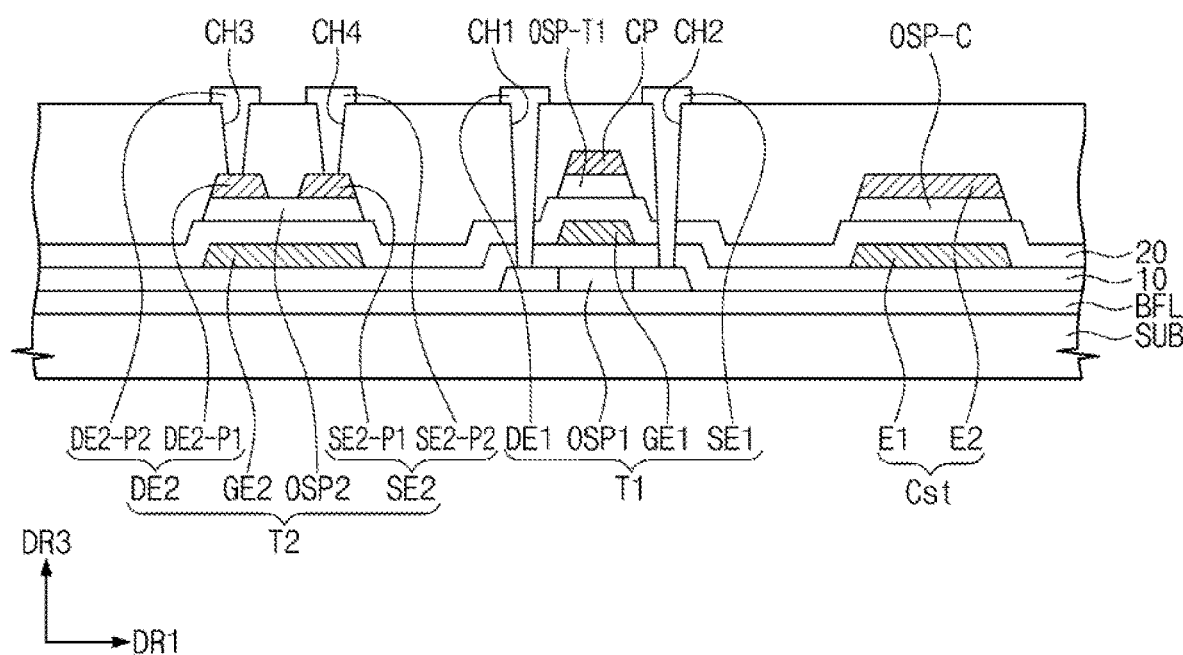
Figure 8F:
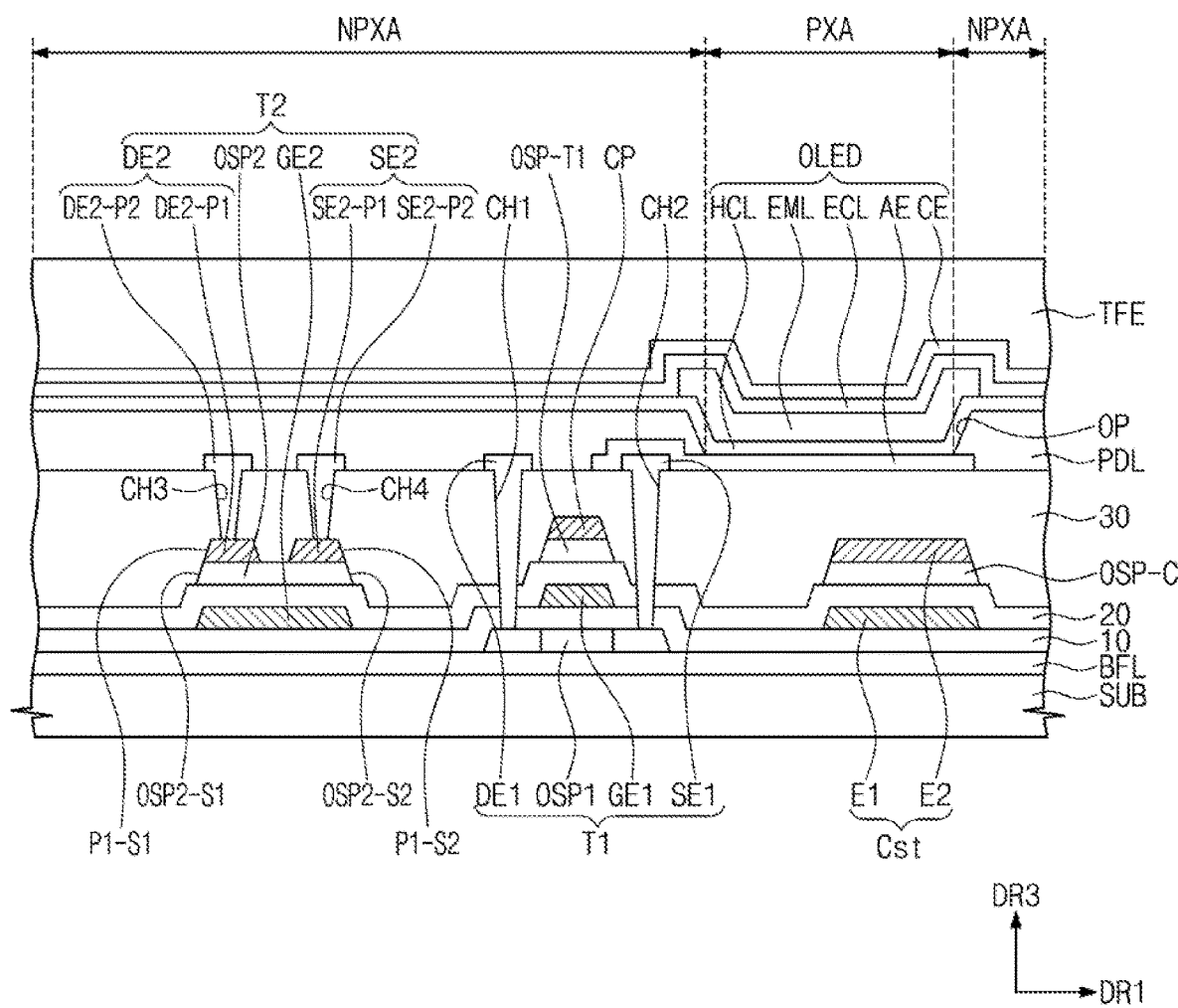

Referring to FIGS. 8D to 8F, processes that are substantially identical to the processes described with reference to FIGS. 6E to 6G may be performed, and thus duplicative descriptions may be omitted.

Figure 9:
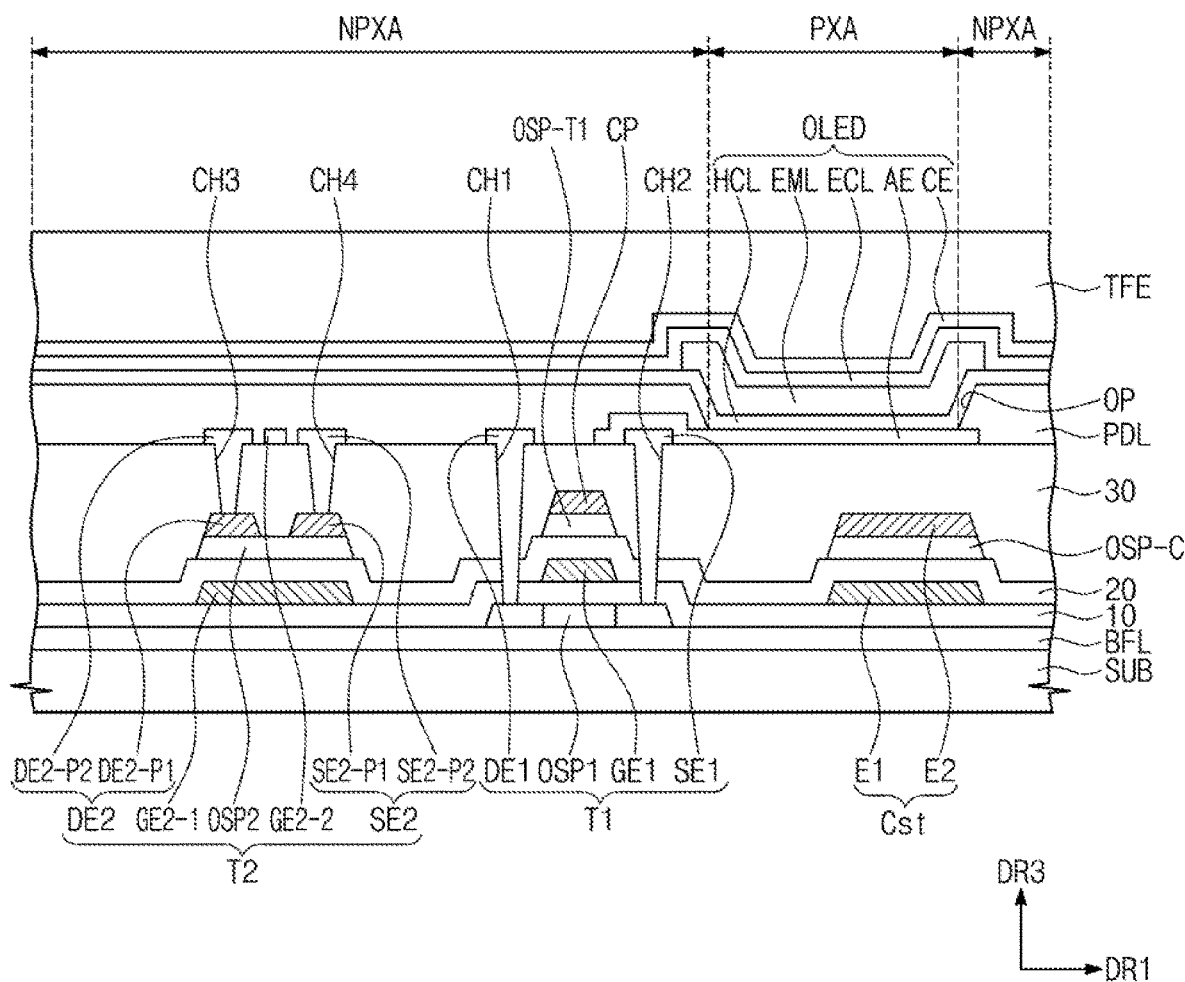
FIG. 9 is a cross-sectional view of a display device according to an exemplary embodiment of the present invention.

FIG. 9 is a cross-sectional view of a display device according to an exemplary embodiment of the present invention.

A display device described below with reference to FIG. 9 may be substantially the same as the display device described above with reference to FIG. 7, and thus duplicative descriptions may be omitted and differences between the display devices may be focused on.

Referring to FIG. 9, a second transistor T2 may include two control electrodes GE2-1 and GE2-2. The second transistor T2 may have a double gate structure. One control electrode GE2-1 (e.g., a lower control electrode) of two control electrodes GE2-1 and GE2-2 may be disposed between the first interlayer insulation layer 10 and the second interlayer insulation layer 20 and the other control electrode GE2-2 (e.g., an upper control electrode) may be disposed on the upper insulation layer 30. The lower control electrode GE2-1 descried with reference to FIG. 9 may be substantially the same as the second control electrode GE2 described with reference FIG. 7, except where differences are described between the lower control electrode GE2-1 and the second control electrode GE2. The upper control electrode GE2-2 may be referred to as a third control electrode.

The upper control electrode GE2-2 may be disposed between the upper portion DE2-P2 of the second input electrode DE2 and the upper portion SE2-P2 of the second output electrode SE2. The lower control electrode GE2-1 and the upper control electrode GE2-2 may be electrically connected to each other. Through a contact hole penetrating the upper insulation layer 30 and the second interlayer insulation layer 20, two control electrodes GE2-1 and GE2-2 may be connected to each other. The upper insulation layer 30 may be a gate insulation layer similar to the second interlayer insulation layer 20.

The upper control electrode GE2-2 and the upper portion DE2-P2 of the second input electrode DE2 may be formed at substantially the same time through a process for forming the upper portion DE2-P2 of the second input electrode DE2 (see, e.g., FIG. 8E). The upper control electrode GE2-2 and the upper portion DE2-P2 of the second input electrode DE2 may include a same material and may have substantially the same layer structure as each other.

The second transistor T2 described above with reference to FIG. 3 may also include two control electrodes GE2-1 and GE2-2.

According to an exemplary embodiment of the present invention, a second interlayer insulation layer, which may be a gate insulation layer in a second thin film transistor, may have a relatively thin thickness. A turn-on current speed and reliability of the second thin film transistor may be increased.

A data line may be disposed on an upper insulation layer. The upper insulation layer may substantially cover a channel area of an oxide semiconductor. An additional inorganic layer for covering the oxide semiconductor may be omitted.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a base substrate;
a first transistor above the base substrate and comprising a first source, a first drain, a first channel area below a first insulation layer, and a first gate above the first insulation layer and below a second insulation layer;
a second transistor above the base substrate and comprising a second source, a second drain, a second gate above the first insulation layer and below the second insulation layer, a second channel area above the second insulation layer and a third gate above the first and the second insulation layers and electrically connected to the second gate;
a third transistor above the base substrate and comprising a third source, a third drain, a third channel area below the first insulation layer, and a fourth gate above the first insulation layer and below the second insulation layer; and
a light emitting diode above the second insulation layer,
wherein one of the first source and the first drain is electrically connected to one of the second source and the second drain.

2. The display device of claim 1, wherein the first channel area comprises polysilicon semiconductor and the second channel area comprises an oxide semiconductor.

3. The display device of claim 2, wherein the third channel area comprises polysilicon semiconductor.

4. The display device of claim 2, wherein the oxide semiconductor comprises vertical crystals.

5. The display device of claim 1, further comprise at least one third insulation layer above the second insulation layer.

6. The display device of claim 1, further comprising a power line to which a first voltage is applied, and
wherein the first transistor is electrically disposed between the power line and the third transistor.

7. The display device of claim 6, wherein the third transistor is electrically disposed between the first transistor and the light emitting diode.

8. The display device of claim 1, further comprising a scan line to which a scan signal is applied, and
wherein the second transistor is turned on by the scan signal.

9. A display device comprising:
a base substrate;
a first transistor above the base substrate and comprising a first source, a first drain, a first channel area below a first insulation layer, and a first gate above the first insulation layer and below a second insulation layer;
a second transistor above the base substrate and comprising a second source, a second drain, a second gate above the first insulation layer and below the second insulation layer, a second channel area above the second insulation layer and a third gate above the first and the second insulation layers and electrically connected to the second gate;
a third transistor above the base substrate and comprising a third source, a third drain, a third channel area below the first insulation layer, and a fourth gate above the first insulation layer and below the second insulation layer; and a light emitting diode above the second insulation layer,
wherein one of the first source and the first drain is electrically connected to one of the third source and the third drain.

10. The display device of claim 9, wherein the first channel area comprises polysilicon semiconductor and the second channel area comprises an oxide semiconductor.

11. The display device of claim 10, wherein the third channel area comprises polysilicon semiconductor.

12. The display device of claim 10, wherein the oxide semiconductor comprises vertical crystals.

13. The display device of claim 9, further comprise at least one third insulation layer above the second insulation layer.

14. The display device of claim 9, further comprising a power line to which a first voltage is applied, and
wherein the first transistor is electrically disposed between the power line and the third transistor.

15. The display device of claim 14, wherein the third transistor is electrically disposed between the first transistor and the light emitting diode.

16. The display device of claim 9, further comprising a scan line to which a scan signal is applied, and
wherein the second transistor is turned on by the scan signal.

* * * * *